United States Patent
Park

(10) Patent No.: US 10,117,332 B2
(45) Date of Patent: Oct. 30, 2018

(54) PRINTED CIRCUIT BOARD

(71) Applicant: Samsung Electronics Co., Ltd., Suwon-si, Gyeonggi-do (KR)

(72) Inventor: Ji-won Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 12 days.

(21) Appl. No.: 15/255,992

(22) Filed: Sep. 2, 2016

(65) Prior Publication Data

US 2017/0094789 A1 Mar. 30, 2017

(30) Foreign Application Priority Data

Sep. 25, 2015 (KR) .................. 10-2015-0137105

(51) Int. Cl.
  *H05K 1/11* (2006.01)
  *H05K 1/02* (2006.01)
  *H05K 1/18* (2006.01)

(52) U.S. Cl.
  CPC .......... *H05K 1/113* (2013.01); *H05K 1/0295* (2013.01); *H05K 1/111* (2013.01); *H05K 1/0298* (2013.01); *H05K 1/181* (2013.01); *H05K 2201/099* (2013.01); *H05K 2201/09663* (2013.01); *H05K 2201/10636* (2013.01); *Y02P 70/611* (2015.11)

(58) Field of Classification Search
  CPC ....... H05K 1/113; H05K 1/0298; H05K 1/181
  See application file for complete search history.

(56) References Cited

U.S. PATENT DOCUMENTS

| | | | |
|---|---|---|---|
| 4,836,435 A * | 6/1989 | Napp | H05K 1/111 228/180.22 |
| 5,303,122 A | 4/1994 | Adams, Jr. et al. | |
| 5,683,788 A | 11/1997 | Dugan et al. | |
| 7,186,926 B2 * | 3/2007 | Maeno | H05K 1/111 174/260 |
| 7,423,221 B2 | 9/2008 | Matsuda | |
| 7,448,016 B2 | 11/2008 | Tai et al. | |
| 7,916,495 B2 | 3/2011 | Huang | |
| 2007/0074898 A1 | 4/2007 | Tai et al. | |
| 2008/0305660 A1 * | 12/2008 | Cao | H05K 1/111 439/78 |
| 2009/0185096 A1 | 7/2009 | Park | |
| 2015/0342045 A1 * | 11/2015 | Nakabayashi | G02B 6/0073 362/611 |

FOREIGN PATENT DOCUMENTS

| | | |
|---|---|---|
| JP | 08-279661 | 10/1996 |
| JP | 10-022617 | 1/1998 |
| JP | 10-321998 | 12/1998 |

(Continued)

*Primary Examiner* — Ishwarbhai B Patel
(74) *Attorney, Agent, or Firm* — Ward and Smith, P.A.

(57) ABSTRACT

A printed circuit board (PCB) is disclosed on which various kinds of electronic components having diverse specifications may be mounted. The PCB includes a substrate base and a pad group formed on a surface of the substrate base. The pad group includes at least two pads. Each of the at least two pads includes a first sub-pad portion and a second sub-pad portion. The first sub-pad portion partially surrounds the second sub-pad portion. The second sub-pad portion of one of the at least two pads protrudes from an end portion of the first sub-pad portion toward another pad of the at least two pads.

20 Claims, 42 Drawing Sheets

(56) References Cited

FOREIGN PATENT DOCUMENTS

| | | |
|---|---|---|
| JP | 2003-243814 | 8/2003 |
| JP | 2006-303388 | 11/2006 |
| JP | 2007-080969 | 3/2007 |
| JP | 2012-064720 | 3/2012 |
| JP | 2014-220480 | 11/2014 |
| JP | 2014-225642 | 12/2014 |
| KR | 1019970032317 | 6/1997 |
| KR | 1020040070926 | 8/2004 |

* cited by examiner

PRINTED CIRCUIT BOARD

CROSS-REFERENCE TO RELATED APPLICATION

This application claims the benefit of Korean Patent Application No. 10-2015-0137105, filed on Sep. 25, 2015, in the Korean Intellectual Property Office, the disclosure of which is incorporated herein in its entirety by reference.

BACKGROUND

The inventive concepts described herein relate to printed circuit boards (PCBs), and more particularly, to PCBs having a pad on which electronic components may be mounted.

To manufacture an electronic device, various kinds of electronic components may be mounted on a PCB. The size of electronic components included in the electronic device and the arrangement of connection terminals may vary based on the kinds of electronic components utilized in the electronic device. Even if the electronic components are of the same kind, the sizes of the electronic components and the arrangement of the connection terminals may vary depending on the particular design specifications of the electronic device.

Accordingly, to manufacture an electronic device, it is desirable to use a PCB that has been designed with consideration given to the sizes of various kinds of electronic components that may be included in the electronic device and to the arrangement of the connection terminals of the electronic components.

SUMMARY

The inventive concepts provide printed circuit boards (PCBs) on which various kinds of electronic components having various specifications may be mounted.

According to an aspect of the inventive concepts, there is provided a PCB including a substrate base, and a pad group formed on a surface of the substrate base. The pad group includes at least two pads. Each of pads includes a first sub-pad portion and a second sub-pad portion. The first sub-pad portion partially surrounds the second sub-pad portion. The second sub-pad portion of one of the at least two pads protrudes from an end portion of the first sub-pad portion toward another pad of the at least two pads.

The first and second sub-pad portions included in one of the at least two pads may be portions of a conductive pattern, which are integrally formed and are at a same level as the surface of the substrate base. The PCB may further include a solder resist layer having an opening exposing the first sub-pad portion and the second sub-pad portion. The solder resist layer covers a portion of the conductive pattern to surround each of the first and second sub-pad portions.

The first and second sub-pad portions included in one of the at least two pads may be connected to each other by a connection bridge located in a portion of a space between the first and second sub-pad portions. The first sub-pad portion, the second sub-pad portion, and the connection bridge may be integrally formed and be at a same level as the surface of the substrate base.

The first and second sub-pad portions included in one of the at least two pads may be spaced apart from each other and electrically connected to each other by a buried conductive layer formed in the substrate base.

The PCB may further include a conductive via extending from each of the first and second sub-pad portions into the substrate base and connecting each of the first and second sub-pad portions to the buried conductive layer.

Each of the at least two pads may further include a third sub-pad portion located between the first sub-pad portion and the second sub-pad portion. The third sub-pad portion of one of the at least two pads may protrude from an end portion of the first sub-pad portion toward another pad, and the second sub-pad portion of the one pad may protrude from an end portion of the third sub-pad portion toward another pad.

The second sub-pad portion may have a tetragonal shape, and each of the first and third sub-pad portions may have a U shape.

Each of the first and third sub-pad portions may surround one side of an edge of the second sub-pad portion and partially surround two sides of the second sub-pad portion connected to the one side.

A side of the second sub-pad portion opposite to the one side of the second sub-pad portion may protrude from end portions of the first and third sub-pad portions.

The second sub-pad portion may have a tetragonal shape, and each of the first and third sub-pad portions may have an L shape.

Each of the first and third sub-pad portions may surround a first corner of the second sub-pad portion and partially surround two sides of the second sub-pad portion which intersect at the first corner.

Two sides of the second sub-pad portion which intersect at a second corner of the second sub-pad portion may protrude from the end portions of the first and third sub-pad portions.

The first to third sub-pad portions included in one of the at least two pads may be portions of a conductive pattern, which are integrally formed and are at the same level as a main surface of the substrate base. The PCB may further include a solder resist layer covering a portion of the conductive pattern to surround each of the first, second, and third sub-pad portions.

In one of the at least two pads, the first and third sub-pad portions may be connected to each other by a first connection bridge located in a portion of a space between the first and third sub-pad portions, and the second and third sub-pad portions may be connected to each other by a second connection bridge located in a portion of a space between the second and third sub-pad portions. The first sub-pad portion, the second sub-pad portion, the third sub-pad portion, and the first and second connection bridges may be integrally formed and be at the same level as a main surface of the substrate base.

The first to third sub-pad portions included in one of the at least two pads may be spaced apart from one another and electrically connected to one another by a buried conductive layer formed in the substrate base.

The PCB may further include a conductive via extending from each of the first to third sub-pad portions into the substrate and connecting each of the first to third sub-pad portions to the buried conductive layer.

The PCB may further include an interconnection pattern extending from the first sub-pad portion, and a conductive via extending from each of the second sub-pad portion, the third sub-pad portion, and the interconnection pattern into the substrate base and connecting each of the second and third sub-pad portions and the interconnection pattern to the buried conductive layer.

The PCB may further include an interconnection pattern configured to electrically connect the first and second sub-pad portions with each other. The first sub-pad portion, the second sub-pad portion, and the interconnection pattern may be portions of a conductive pattern layer, which are integrally formed and are at the same level as a main surface of the substrate base. The third sub-pad portion may be spaced apart from the first and second sub-pad portions and electrically connected to any one of the first sub-pad portion and the second sub-pad portion by a buried conductive layer formed in the substrate base.

Each of one of the first sub-pad portion and the second sub-pad portion and the third sub-pad portion may be connected to the buried conductive layer by a conductive via extending from a surface of the substrate base into the substrate base.

The interconnection pattern may extend along circumference of the pad including the first to third sub-pad portions.

According to another aspect of the inventive concepts, there is provided a PCB including a substrate base, and a pad group formed on a surface of the substrate base, the pad group comprising at least two pads, each pad comprising a plurality of first sub-pad portions and a second sub-pad portion having a rectangular shape. The respective first sub-pad portions may partially surround the second sub-pad portion and be sequentially arranged in a direction away from the second sub-pad portion. The second sub-pad portion of one of the at least two pads may protrude from an end portion of each of the first sub-pad portions toward another pad of the at least two pads.

Among the plurality of first sub-pad portions included in one of the at least two pads, an end portion of a first sub-pad portion near to the second sub-pad portion may extend toward another pad of the at least two pads more than an end portion of a first sub-pad portion far from the second sub-pad portion.

Each of the plurality of first sub-pad portions included in the one pad may have a U shape.

One side of an edge of the second sub-pad portion of the one pad may protrude from an end portion of each of the plurality of first sub-pad portions toward another pad.

Each of the plurality of first sub-pad portions of the one pad may surround a side of the second sub-pad portion opposite to the one side of the second sub-pad portion and partially surround two sides of the second sub-pad portion connected to the opposite side.

Each of the plurality of first sub-pad portions included in the one pad may have an L shape.

Two sides of the second sub-pad portion which intersect at a first corner of the second sub-pad portion of the one pad may protrude from an end portion of each of the plurality of first sub-pad portions toward the another pad.

Each of the plurality of first sub-pad portions of the one pad may surround a second corner opposite to the first corner of the second sub-pad portion and partially surround two sides of the second sub-pad portion which intersect at the second corner.

The pad group may include at least three pads. Each of the plurality of first sub-pad portions included in at least one pad included in the pad group may have a U shape. Each of the plurality of first sub-pad portions included in at least a pair of other pads may have an L shape.

The number of pads included in the pad group may be at least a multiple of 4. Each of the plurality of first sub-pad portions included in each of the pads included in the pad group may have an L shape.

BRIEF DESCRIPTION OF THE DRAWINGS

Some embodiments of the inventive concepts will be more clearly understood from the following detailed description taken in conjunction with the accompanying drawings in which.

DETAILED DESCRIPTION OF THE EMBODIMENTS

Figure 1A:
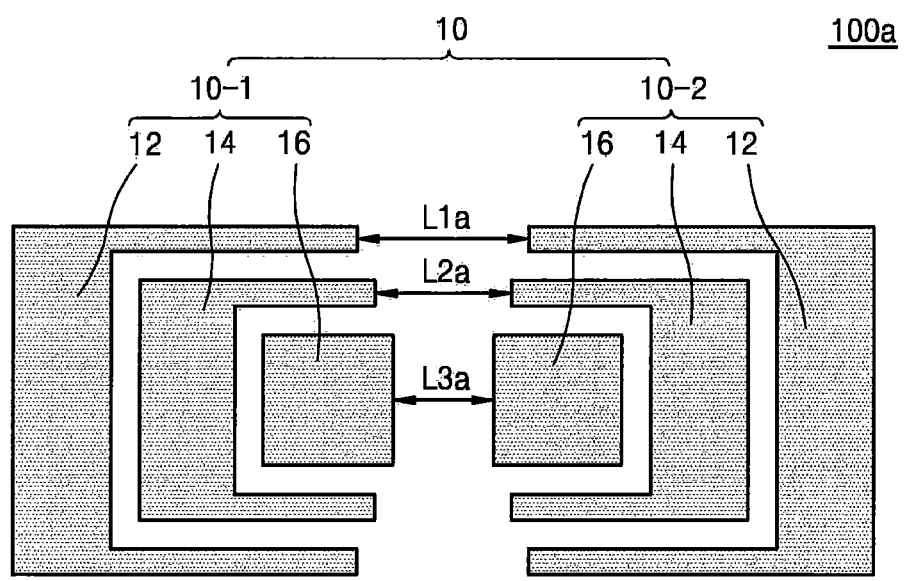
FIGS. 1A to 1D are schematic plan views of pad groups formed on printed circuit boards (PCBs) according to some embodiments.

As used herein, the term "and/or" includes any and all combinations of one or more of the associated listed items. Expressions such as "at least one of," when preceding a list of elements, modify the entire list of elements and do not modify the individual elements of the list.

The inventive concepts will now be described more fully hereinafter with reference to the accompanying drawings, in which embodiments of the inventive concept are shown. This inventive concepts may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions are exaggerated for clarity, and proportions of respective components may be exaggerated or reduced.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the specification, an expression "pad group" refers to a set of pads to be respectively connected to at least two connection terminals included in an electronic component so that the electronic component including the at least two connection terminals may be mounted on the PCB. For example, a pad group including two pads may be formed on a PCB so that an electronic component having two connection terminals may be mounted on the PCB. Also, a pad group including four pads may be formed on a PCB so that an electronic component having four connection terminals may be mounted on the PCB. A plurality of pad groups may be formed on a PCB to accommodate the mounting of a number of electronic components on the PCB.

Unless otherwise defined, all terms (including technical and scientific terms) used herein have the same meaning as commonly understood by one of ordinary skill in the art to which the inventive concept belongs.

The inventive concept will now be described more fully hereinafter with reference to the accompanying drawings, in which embodiments of the inventive concept are shown.

FIGS. 1A, 1B 1C and 1D are schematic plan views of pad groups 10 and 20 formed on PCBs 100a and 100b according to some embodiments.

Figure 1B:
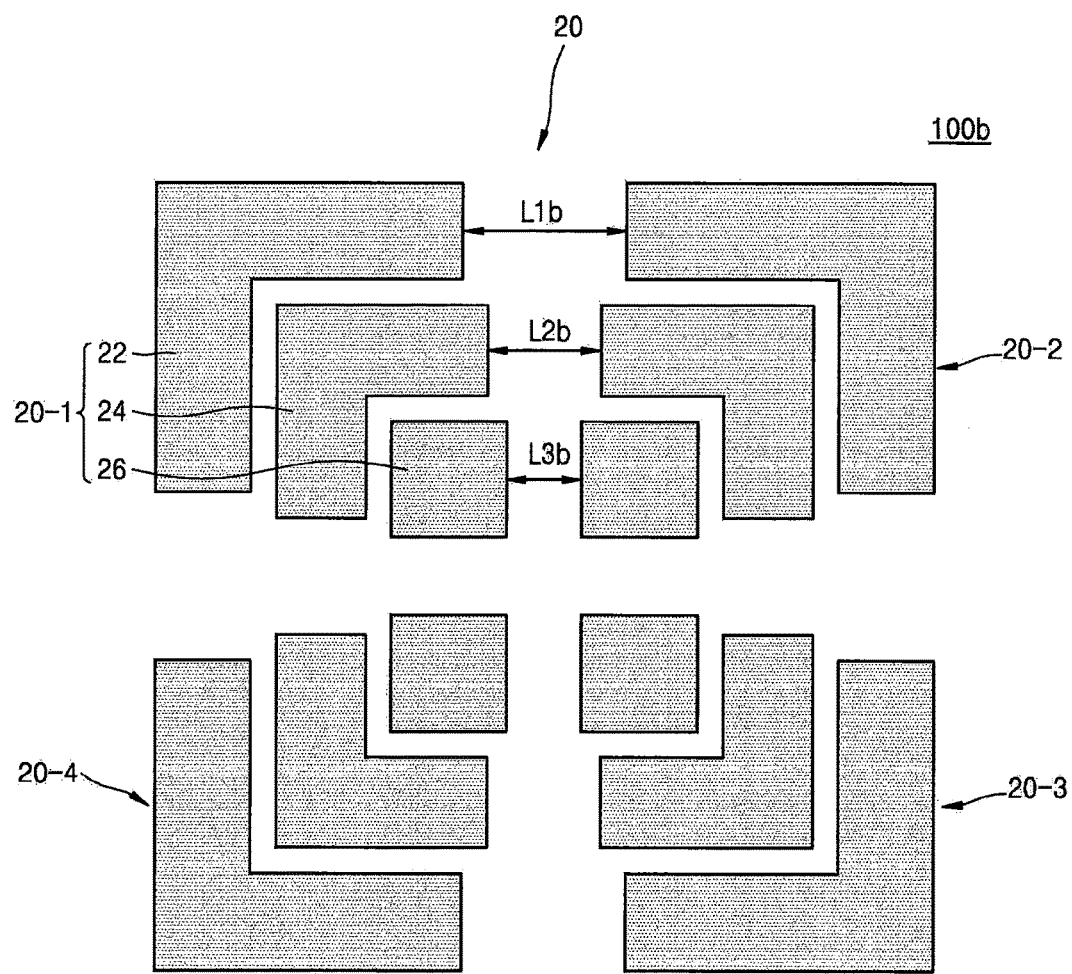
Figure 1C:
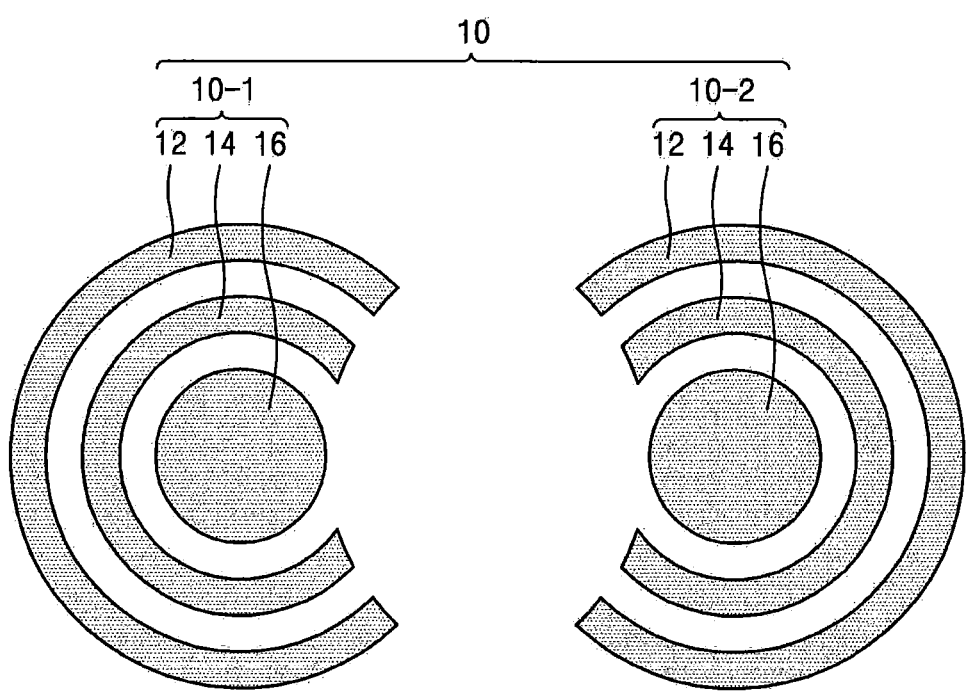

In FIGS. 1A and 1B, only planar shapes of one pad group formed on a PCB and pads included in the one pad group are illustrated, and all other elements included in the PCB are omitted. Also, from among each of the pads, only shapes of sub-pad portions used to connect each of the pads with an electronic component are illustrated. Other elements included in the PCB and connection relationships between the sub-pad portions will be described later with reference to FIGS. 2A to 10C.

Referring to FIG. 1A, the PCB 100a may include a pad group 10 including a plurality of pads, such as first and second pads 10-1 and 10-2. For example, when an electronic component to be mounted on the PCB 100a has two connection terminals, the pad group 10 may include the first pad 10-1 and the second pad 10-2 corresponding to the electronic component having the two connection terminals.

Each of the first and second pads 10-1 and 10-2 may include a plurality of sub-pad portions, such as first, second, and third sub-pad portions 12, 14, and 16. FIG. 1A illustrates a case in which each of the first and second pads 10-1 and 10-2 includes three sub-pad portions 12, 14, and 16, but the inventive concepts are not limited thereto, and each of the first and second pads 10-1 and 10-2 may include two, four, or more sub-pad portions.

Figure 1D:
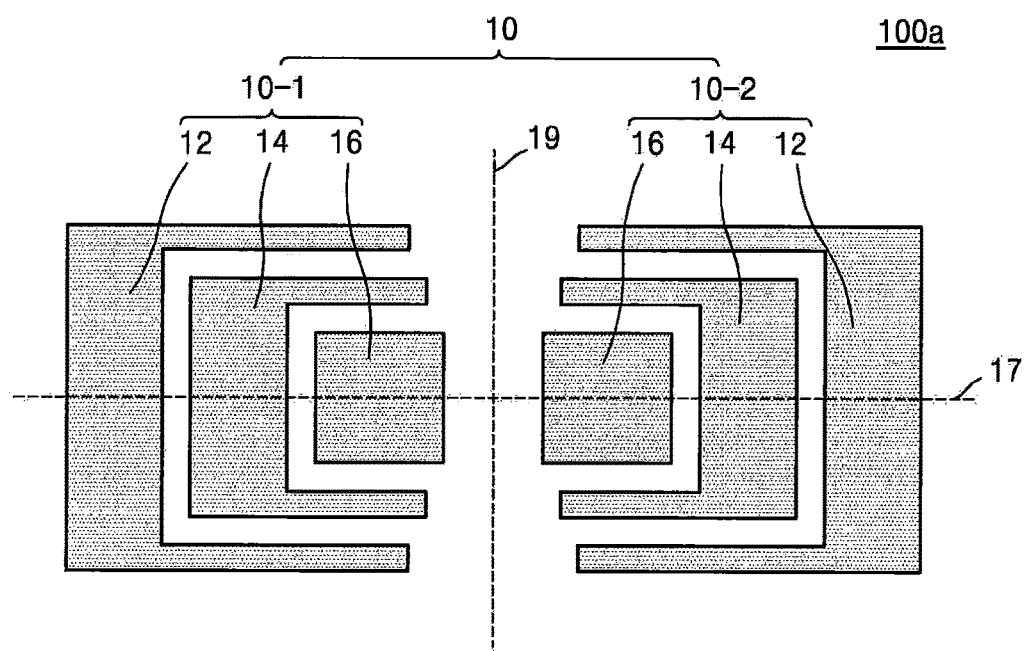

For example, when each of two ends of the electronic component to be mounted on the PCB 100a has one connection terminal, the first pad 10-1 and the second pad 10-2 may be symmetric with respect to a vertical line 19 running between the first pad 10-1 and the second pad 10-2 (FIG. 1D). Specifically, the first to third sub-pad portions 12, 14, and 16 included in the first pad 10-1 may be symmetric to the first to third sub-pad portions 12, 14, and 16 included in the second pad 10-2 with respect to the vertical line 19 passing between the first pad 10-1 and the second pad 10-2 in terms of shapes and arrangements. Accordingly, since all descriptions of the first pad 10-1 are applicable to the second pad 10-2 except for line symmetry, repeated descriptions thereof are omitted.

Moreover, as also illustrated in FIG. 1D, each of the first and second pads 10-1 and 10-2 may be self-symmetric about a horizontal line 17 that is perpendicular to the vertical line 19 and that runs through the first and second pads 10-1 and 10-2.

Referring again to FIG. 1A, the first pad 10-1 may include the first to third sub-pad portions 12, 14, and 16. The first and second sub-pad portions 12 and 14 may partially surround the third sub-pad portion 16. The first sub-pad portion 12 may partially surround the second sub-pad portion 14. That is, the second sub-pad portion 14 may be located between the first sub-pad portion 12 and the third sub-pad portion 16 so that the second sub-pad portion 14 and the first sub-pad portion 12 may partially surround the third sub-pad portion 16 and be sequentially arranged in a direction away from the third sub-pad portion 16.

The first sub-pad portion 12 may be spaced a predetermined distance apart from the second sub-pad portion 14, and the second sub-pad portion 14 may be spaced a predetermined distance apart from the third sub-pad portion 16. In some embodiments, a connection bridge for electrical connection may be formed in a portion of a space between the first sub-pad portion 12 and the second sub-pad portion 14 and/or a portion of a space between the second sub-pad portion 14 and the third sub-pad portion 16. As used herein, a "connection bridge" refers to a conductive connection across a nonconductive surface or area of a substrate.

In the first pad 10-1, the third sub-pad portion 16 may protrude from end portions of the first and second sub-pad portions 12 and 14 toward the second pad 10-2, and the second sub-pad portion 14 may protrude from the end portion of the first sub-pad portion 12 toward the second pad 10-2. That is, the end portion of the second sub-pad portion 14 of the second pad 10-2 may extend toward the second pad 10-2 further than the end portion of the first sub-pad portion 12. Also, the second sub-pad portion 14 and the first sub-pad portion 12 of the first pad 10-1 may partially surround the third sub-pad portion 16 and be sequentially arranged in a direction away from the second pad 10-2.

Accordingly, a distance L1a between the respective first sub-pad portions 12 of the first and second pads 10-1 and 10-2 may be more than a distance L2a between the respective second sub-pad portions 14 of the first and second pad 10-1 and 10-2. The distance L2a between the respective second sub-pad portions 14 of the first and second pads 10-1 and 10-2 may be more than a distance L3a between the third sub-pad portions 16 of the first and second pads 10-1 and 10-2.

The third sub-pad portion 16 may have a tetragonal shape. For example, the third sub-pad portion 16 may have a rectangular shape. Each of the first and second sub-pad portions 12 and 14 may have a U shape. Each of the first and second sub-pad portions 12 and 14 may include a portion that is recessed inward from one side of a quasi tetragonal shape including the corresponding one of the first and second sub-pad portions 12 and 14. Each of the first and second sub-pad portions 12 and 14 of the first pad 10-1 may include a portion that is recessed inward from one side of a quasi tetragonal shape including the corresponding one of the first and second sub-pad portions 12 and 14, which faces the second pad 10-2.

Each of the first and second sub-pad portions 12 and 14 may wholly surround one side of an edge of the third sub-pad portion 16 (i.e., a left side of the third sub-pad portion 16 of the first pad 10-1 of FIG. 1A) and may partially surround two sides of the third sub-pad portion 16 connected to the one side. A side of the third sub-pad portion 16 (or a right side of the third sub-pad portion 16 of the first pad 10-1 of FIG. 1A), which is opposite to the one side (or the left side of the third sub-pad portion 16 of the first pad 10-1 of FIG. 1A) of the third sub-pad portion 16 that is surrounded with the first and second sub-pad portions 12 and 14, may not be surrounded by the first and second sub-pad portions 12 and 14 but may protrude from end portions of the first and second sub-pad portions 12 and 14. The first sub-pad portion 12 may wholly surround one side of an edge of the quasi tetragonal shape including the second sub-pad portion 14, and may partially surround the two sides of the quasi tetragonal shape that are connected to the one side.

The second sub-pad portion 14 may partially surround the third sub-pad portion 16 such that a portion of the third sub-pad portion 16 is contained in the recessed portion of the second sub-pad portion 14. The first sub-pad portion 12 may partially surround the second sub-pad portion 14 such that a portion of the second sub-pad portion 14 is contained in the recessed portion of the first sub-pad portion 12. In some embodiments, the first sub-pad portion 12 may partially surround the second and third sub-pad portions 14 and 16 such that not only the portion of the second sub-pad portion 14 but also a portion of the third sub-pad portion 16 are contained in the recessed portion of the first sub-pad portion 12.

Each of the quasi tetragonal shapes including the first and second sub-pad portions 12 and 14 and the tetragonal shape of the third sub-pad portion 16 may provide a connection region for one connection terminal of the electronic component. That is, the connection region for one connection terminal of the electronic component may correspond to a portion of the second sub-pad portion 14 (or a portion of each of the second and third sub-pad portions 12 and 14) and the first sub-pad portion 12, a portion of the third sub-pad portion 16 and the second sub-pad portion 14, or the third sub-pad portion 16. The connection region will be described in detail with reference to FIGS. 2A to 4D.

However, shapes of the first to third sub-pad portions 12, 14, and 16 are not limited thereto. For example, the third sub-pad portion 16 may have a circular shape, and each of the first and second sub-pad portions 12 and 14 may have an arc shape as illustrated, for example, in FIG. 1C.

In some embodiments, when the first pad 10-1 includes two sub-pad portions, the first pad 10-1 may include not the first sub-pad portion 12 but only the second sub-pad portion 14 and the third sub-pad portion 16.

In some embodiments, when the first pad 10-1 includes at least four sub-pad portions, the first pad 10-1 may further include the third sub-pad portion 16 and at least three sub-pad portions that partially surround the third sub-pad portion 16 and are sequentially arranged in the direction away from the third sub-pad portion 16. That is, when the first pad 10-1 includes at least four sub-pad portions, the first pad 10-1 may further include at least one sub-pad portion that partially surrounds the first sub-pad portion 12 in a similar way to the embodiments illustrated in FIG. 1A in which the first sub-pad portion 12 partially surrounds the second sub-pad portion 14.

Referring to FIG. 1B, the PCB 100b may include a pad group 20 including a plurality of pads, such as first to fourth pads 20-1, 20-2, 20-3, and 20-4. For example, when an electronic component to be mounted on the PCB 100b has connection terminals, the pad group 20 may include the first to fourth pads 20-1, 20-2, 20-3, and 20-4 corresponding to the electronic component having the four connection terminals.

Each of the first to fourth pads 20-1, 20-2, 20-3, and 20-4 may include a plurality of sub-pad portions, for example, first to third sub-pad portions 22, 24, and 26. FIG. 1B illustrates a case in which each of the first to fourth pads 20-1, 20-2, 20-3, and 20-4 includes three sub-pad portions 22, 24, and 26, but the inventive concepts are not limited thereto. Each of the first to fourth pads 20-1, 20-2, 20-3, and 20-4 may include two sub-pad portions or at least four sub-pad portions.

For example, when each of four ends of the electronic component to be mounted on the PCB 100b has one connection terminal, the first pad 20-1 may be line-symmetric to the second pad 20-2 or the fourth pad 20-4, and the third pad 20-3 may be line-symmetric to the second pad 20-2 or the fourth pad 20-4. The first pad 20-1 may be point-symmetric to the third pad 20-3, and the second pad 20-2 may be point-symmetric to the fourth pad 20-4. Accordingly, since all descriptions of the first pad 20-1 are applicable to the second to fourth pads 20-2, 20-3, and 20-4 except for line symmetry or point symmetry, repeated descriptions thereof are omitted.

The first pad 20-1 may include the first to third sub-pad portions 22, 24, and 26. The first and second sub-pad portions 22 and 24 may partially surround the third sub-pad portion 26. The first sub-pad portion 22 may partially surround the second sub-pad portion 24. That is, the second sub-pad portion 24 may be located between the first sub-pad portion 22 and the third sub-pad portion 26 so that the second sub-pad portion 24 and the first sub-pad portion 22 may partially surround the third sub-pad portion 26 and be sequentially arranged in a direction away from the third sub-pad portion 26.

The first sub-pad portion 22 may be spaced a predetermined distance apart from the second sub-pad portion 24, and the second sub-pad portion 24 may be spaced a predetermined distance apart from the third sub-pad portion 26. In some embodiments, a connection bridge for electrical connection may be formed in a portion of a space between the first sub-pad portion 22 and the second sub-pad portion 24 and/or a portion of a space between the second sub-pad portion 24 and the third sub-pad portion 26.

The third sub-pad portion 26 of the first pad 20-1 may protrude from end portions of the first and second sub-pad portions 22 and 24 toward other pads (i.e., the second to fourth pads 20-2, 20-3, and 20-4), and the second sub-pad portion 24 of the first pad 20-1 may protrude from the end portion of the second sub-pad portion 22 toward other pads (i.e., the second to fourth pads 20-2, 20-3, and 20-4. That is, the end portion of the second sub-pad portion 24 of the first pad 20-1 may extend toward the second to fourth pads 20-2, 20-3, and 20-4 more than the end portion of the first sub-pad portion 22. Also, the second sub-pad portion 24 and the first sub-pad portion 22 of the first pad 20-1 may partially surround the third sub-pad portion 26 and be sequentially arranged in the direction away from the second to fourth pads 20-2, 20-3, and 20-4.

Accordingly, a distance L1b between the first sub-pad portions 22 of two adjacent ones of the first to fourth pads 20-1, 20-2, 20-3, and 20-4 may be more than a distance L2b between the second sub-pad portions 24 of two adjacent ones of the first to fourth pads 20-1, 20-2, 20-3, and 20-4. The distance L2b between the second sub-pad portions 24 may be more than a distance L3b between the third sub-pad portion 26 of two adjacent ones of the first to fourth pads 20-1, 20-2, 20-3, and 20-4. FIG. 1B illustrates only the distances L1b, L2b, and L3b between the first to third sub-pad portions 22, 24, and 26 of the first pad 20-1 and the first to third sub-pad portions 22, 24, and 26 of the second pad 20-2, the same relationships as described above may be applied likewise to distances between the first to third sub-pad portions 22, 24, and 26 of the first pad 20-1 and the first to third sub-pad portions 22, 24, and 26 of the third pad 20-3 and distances between the first to third sub-pad portions 22, 24, and 26 of the first pad 20-1 and the first to third sub-pad portions 22, 24, and 26 of the fourth pad 20-4.

The third sub-pad portion 26 may have a tetragonal shape. For example, the third sub-pad portion 26 may have a rectangular shape. Each of the first and second sub-pad portions 22 and 24 may have an L shape. Each of the first and second sub-pad portions 22 and 24 may have a portion that is recessed inward from one corner of a quasi tetragonal shape including the corresponding one of the first and second sub-pad portions 22 and 24. Each of the first and second sub-pad portions 22 and 24 of the first pad 20-1 may have a portion that is recessed inward from one corner of the quasi tetragonal shape including the corresponding one of the first and second sub-pad portions 22 and 24, which faces the third pad 20-3.

The first and second sub-pad portions 22 and 24 may surround one corner of an edge of the third sub-pad portion 26 (or an upper left corner of the third sub-pad portion 26 of the first pad 20-1 of FIG. 1B) and partially surround two sides (left and upper sides of the third sub-pad portion 26 of the first pad 20-1 of FIG. 1B) of the third sub-pad portion 26 which may intersect at the one corner. A corner of the third sub-pad portion 26 (or a lower right corner of the third sub-pad portion 26 of the first pad 20-1 of FIG. 1B), which is opposite to the one corner (or the upper left corner of the third sub-pad portion 26 of the first pad 20-1 of FIG. 1B) of the third sub-pad portion 26, which is surrounded with the first and second sub-pad portions 22 and 24, and two sides (or right and lower sides of the third sub-pad portion 26 of the first pad 20-1 of FIG. 1B) of the third sub-pad portion 26, which may intersect at the opposite corner, may protrude away from end portions of the first and second sub-pad portions 22 and 24.

The first sub-pad portion 22 may surround one corner of an edge of a quasi tetragonal shape including the second sub-pad portion 24 and partially surround two sides of the quasi tetragonal shape which may intersect at the one corner.

The second sub-pad portion 24 may partially surround the third sub-pad portion 26 such that a portion of the third sub-pad portion 26 is contained in the recessed portion of the second sub-pad portion 24. The first sub-pad portion 22 may partially surround the second sub-pad portion 24 such that a portion of the second sub-pad portion 24 is contained in the recessed portion of the first sub-pad portion 22. In some embodiments, the first sub-pad portion 22 may partially surround the second and third sub-pad portions 24 and 26 such that not only the portion of the second sub-pad portion 24 but also a portion of the third sub-pad portion 26 are contained in the recessed portion of the first sub-pad portion 22.

Each of the quasi tetragonal shapes including the first and second sub-pad portions 22 and 24 and the tetragonal shape of the third sub-pad portion 26 may be a connection region for one connection terminal of the electronic component. That is, the connection region for the one connection terminal of the electronic component may correspond to a portion of the second sub-pad portion 24 (or a portion of each of the second and third sub-pad portions 22 and 24) and the first sub-pad portion 22, a portion of the third sub-pad portion 26 and the second sub-pad portion 24, or the third sub-pad portion 26. The connection region will be described in detail with reference to FIGS. 2A to 4D.

However, shapes of the first to third sub-pad portions 22, 24, and 26 are not limited thereto. For example, the third sub-pad portion 26 may have a circular shape, and each of the first and second sub-pad portions 22 and 24 may have an arc shape.

In some embodiments, when the first pad 20-1 includes two sub-pad portions, the first pad 20-1 may not include the first sub-pad portion 22 but only the second sub-pad portion 24 and the third sub-pad portion 26.

In some embodiments, when the first pad 20-1 includes at least four sub-pad portions, the first pad 20-1 may further include the third sub-pad portion 26 and at least three sub-pad portions that partially surround the third sub-pad portion 26 and are sequentially arranged in the direction away from the third sub-pad portion 16. That is, when the first pad 20-1 includes at least four sub-pad portions, the first pad 20-1 may further include at least one sub-pad portion that partially surrounds the first sub-pad portion 22 in a similar way to a case of FIG. 1B in which the first sub-pad portion 22 partially surrounds the second sub-pad portion 24.

The PCB 100a shown in FIG. 1A and the PCB 100b shown in FIG. 1B may be PCBs according to different some embodiments or indicate portions of a PCB according to an exemplary embodiment. For example, when both at least one electronic component having two connection terminals and at least one electronic component having four connection terminals are mounted on a single PCB, at least one pad group 10 shown in FIG. 1A may be formed in a portion of the single PCB, while at least one pad group 20 shown in FIG. 1B may be formed on another portion of the single PCB.

FIGS. 2A to 5D illustrate methods and states of mounting electronic components having different sizes on the pad groups 10 and 20 of the PCBs 100a and 100b shown in FIGS. 1A and 1B. Specifically, FIGS. 2A to 2D illustrate a method and state of mounting an electronic component having a relatively large size, FIGS. 3A to 3D illustrate a method and state of mounting an electronic component having a relatively medium size, and FIGS. 4A to 4D illustrate a method and state of mounting an electronic component having a relatively small size.

Figure 2A:
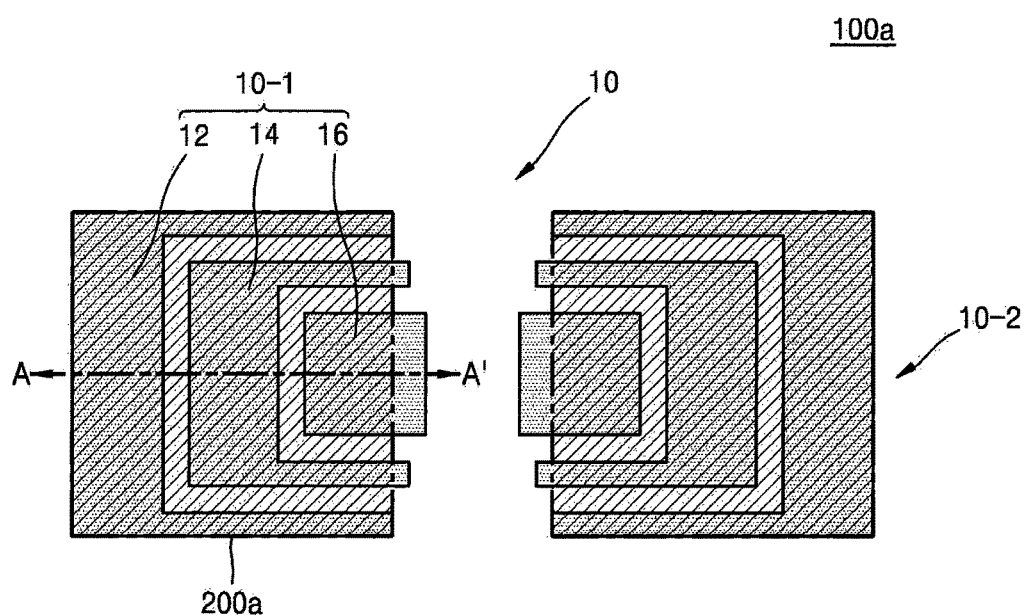
FIGS. 2A to 2C are schematic plan views and cross-sectional view of pad groups formed on PCBs according to some embodiments.
Figure 2B:
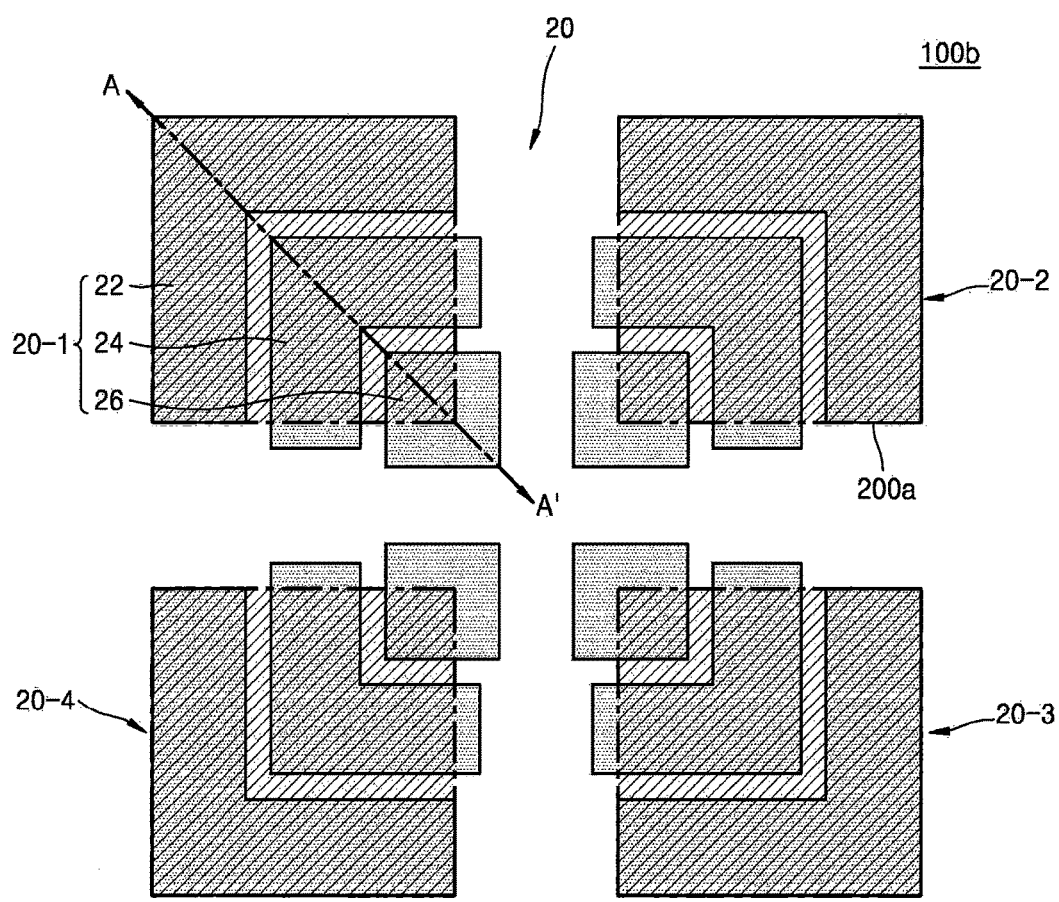
Figure 2C:
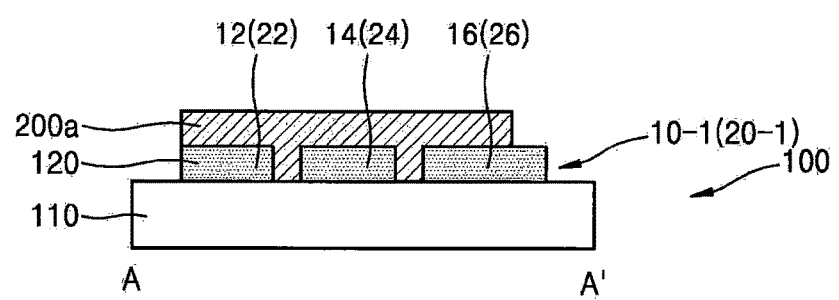
Figure 2D:
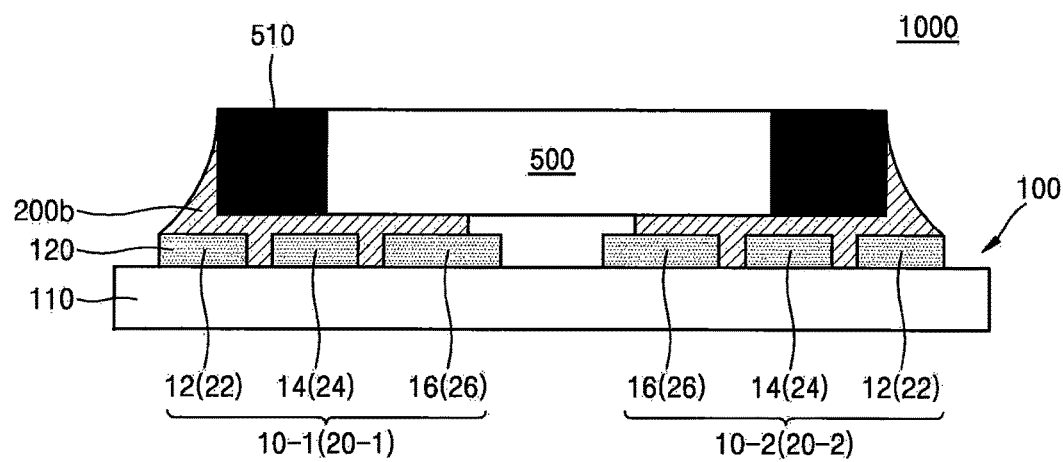
FIG. 2D is a schematic cross-sectional view of an electronic device according to an exemplary embodiment.

FIGS. 2A to 2C are schematic plan views and cross-sectional view of pad groups 10 and 20 formed on PCBs 100a and 100b according to some embodiments, and FIG. 2D is a schematic cross-sectional view of an electronic device 1000 according to an exemplary embodiment. Specifically, FIGS. 2A and 2B are plan views showing that a solder layer for mounting an electronic component is formed on the PCB 100a of FIG. 1A or the PCB 100b of FIG. 1B. FIG. 2C is a schematic cross-sectional view taken along a line A-N of FIG. 2A or FIG. 2B. FIG. 2D is a schematic cross-sectional view of an electronic device including the PCB 100a of FIG. 2A or the PCB 100b of FIG. 2B. In FIGS. 2A to 2D, the same descriptions as in FIG. 1A or 1B may be omitted.

Referring to FIG. 2A, the PCB 100a may include a pad group 10 including a first pad 10-1 and a second pad 10-2. Each of the first and second pads 10-1 and 10-2 may include a plurality of sub-pad portions 12, 14, and 16.

A solder layer 200a may be formed on a portion of each of the first pad 10-1 and the second pad 10-2. The solder layer 200a may be formed by means of, for example, a screen printing process using a solder paste, but the inventive concepts are not limited thereto. The solder paste may include, for example, Sn/Ag, Sn/Au, Sn/Bi, Sn/Cu, Sn/In, Sn/Sb, Sn/Zn, Sn/Ag/Cu, Sn/Ag/Sb, Sn/Ga/In, Sn/In/Ag, Sn/In/Bi, Sn/Zn/In, Sn/Ag/Cu/Bi, Sn/Ag/Cu/In, Sn/Ag/Cu/Ni, Sn/Ag/Cu/Sb, Sn/Ag/In/Bi, Sn/Cu/Ga/In, Sn/Zn/In/Bi, Sn/Ag/Pb, or Sn/Pb. In some embodiments, the solder paste may further include flux.

The solder layer 200a may cover the entire first sub-pad portion 12 and also cover portions of the second sub-pad portion 14 and/or the third sub-pad portion 16 located in the recessed portion of the first sub-pad portion 12. The solder layer 200a covering the first sub-pad portion 12 and the portions of the second sub-pad portion 14 and/or the third sub-pad portion 16 may also cover spaces between the first to third sub-pad portions 12, 14, and 16 so that the solder layer 200a may be integrally formed. That is, a portion in which the solder layer 200a is formed may be the connection region for the connection terminal of the electronic component described with reference to FIG. 1A.

Although the solder layer 200a does not have the same shape as the third sub-pad portion 16, the solder layer 200a may have a generally similar shape to the third sub-pad portion 16 and a larger area than the third sub-pad portion 16. When the third sub-pad portion 16 has a tetragonal shape and each of the first and second sub-pad portions 12 and 14 has a U shape, the solder layer 200a may have a tetragonal shape.

The solder layer 200a may not cover a portion of the second sub-pad portion 14 and the entire third sub-pad portion 16 or a portion of the third sub-pad portion 16. The solder layer 200a may not cover the portions of the second and third sub-pad portions 14 and 16, which may protrude from an end portion of the first sub-pad portion 12 of the first pad 10-1 toward the second pad 10-2. That is, an edge of the solder layer 200 may include a line connecting an outer edge of the first sub-pad portion 12 and the end portion of the first sub-pad portion 12.

Referring to FIG. 2B, a PCB 100b may include a pad group 20 including first to fourth pads 20-1, 20-2, 20-3, and 20-4. Each of the first to fourth pads 20-1, 20-2, 20-3, and 20-4 may include a plurality of sub-pad portions, for example, first to third sub-pad portions 22, 24, and 26.

A solder layer 200a may be formed on a portion of each of the first to fourth pads 20-1, 20-2, 20-3, and 20-4. The solder layer 200a may be formed by means of, for example, a screen printing process using a solder paste, but the inventive concepts are not limited thereto.

The solder layer 200a may cover the entire first sub-pad portion 22 and also cover the portions of the second sub-pad portion 24 and/or the third sub-pad portion 26, which are located in the recessed portion of the first sub-pad portion 22. The solder layer 200a covering the first sub-pad portion 22 and the portions of the second sub-pad portion 24 and/or the third sub-pad portion 26 may also cover spaces between the first to third sub-pad portions 22, 24, and 26 so that the solder layer 200a may be integrally formed. That is, a portion in which the solder layer 200a is formed may be the connection region for the connection terminal of the electronic component described with reference to FIG. 1B.

Although a shape of the solder layer 200a is not the same as a shape of the third sub-pad portion 26, the solder layer 200a has a generally similar shape to the third sub-pad portion 26 and a larger area than the third sub-pad portion 26. When the third sub-pad portion 26 has a tetragonal shape and each of the first and second sub-pad portions 22 and 24 has an L shape, the solder layer 200a also may have a tetragonal shape.

The solder layer 200a may not cover a portion of the second sub-pad portion 24 and the entire third sub-pad portion 26 or a portion of the third sub-pad portion 26. The solder layer 200a may not cover portions of the second and third sub-pad portions 24 and 26, which may protrude from an end portion of the first sub-pad portion 22 of the first pad 20-1 toward the second pad 20-2 and the fourth pad 20-4. That is, an edge of the solder layer 200a may include a line connecting an outer edge of the first sub-pad portion 22 and the end portion of the first sub-pad portion 22.

Referring to FIG. 2C, a PCB 100 may include a substrate base 110 and a conductive pattern layer 120 formed on a surface of the substrate base 110.

A portion of the conductive pattern layer 120 may be the first pad 10-1 or 20-1 including the first sub-pad portion 12 or 22, the second sub-pad portion 14 or 24, and the third sub-pad portion 16 or 26. Although FIG. 2C illustrates only the portion of the conductive pattern layer 120, which constitutes the first pad 10-1 or 20-1, a portion of the conductive pattern layer 120 other than the first pad 10-1 or 20-1 may be further formed on the surface of the substrate base 110. Although FIG. 2C illustrates only a cross-section of the first pad 10-1 or 20-1, each of the second pad 10-2 or 20-2, the third pad 20-3, and the fourth pad 20-4 shown in FIG. 2A or FIG. 2B may have the same sectional shape as the first pad 10-1 or 20-1 shown in FIG. 2C.

The substrate base 110 may include at least one material selected from a phenol resin, an epoxy resin, and polyimide. For example, the substrate base 110 may include at least one material selected from the group consisting of Flame Retardant 4 (FR4), tetrafunctional epoxy, polyphenylene ether, epoxy/polyphenylene oxide, bismaleimide triazine (BT), Thermount, cyanate ester, polyimide (PI), and a liquid crystal (LC) polymer. The substrate base 110 may be formed by stacking a plurality of base layers.

The conductive pattern layer 120 may include copper, nickel, stainless steel, or beryllium copper. A buried conductive layer (not shown) and a conductive via (not shown) may be formed in the substrate base 120 and electrically connected to the conductive pattern layer 120. For example, the formation of the conductive pattern layer 120 may include coating the substrate base 110 with copper (Cu) foil and patterning the copper foil. The pad 10 or 20 may be a portion of the conductive pattern layer 120, which is exposed by a solder resist layer (not shown).

A solder layer 200a may be formed on the first sub-pad portion 12 or 22, the second sub-pad portion 14 or 24, and third sub-pad portion 16 or 26. The solder layer 200a may also be formed on the substrate base 110 among the first sub-pad portion 12 or 22, the second sub-pad portion 14 or 24, and the third sub-pad portion 16 or 26.

Referring to FIG. 2D, an electronic device 1000 may include an electronic component 500 mounted on a PCB 100. The PCB 100 may include a substrate base 110 and at least two pads 10-1 and 10-2 or 20-1 and 20-2, which may constitute a portion of the conductive pattern layer 120 formed on a surface of the substrate base 110.

The electronic component 500 may be an active device or a passive device, such as a resistor, a capacitor, an inductor, a switch, a temperature sensor, a DC-DC converter, or a quartz or voltage regulator configured to generate a clock. Alternatively, the electronic component 500 may be a semiconductor device, such as a diode or a transistor. Alternatively, the electronic component 500 may be an integrated circuit (IC) having a relatively small number of connection terminals. The electronic component 500 may have at least two connection terminals 510. The electronic component 500 may have, for example, n connection terminals 510, where n is an integer greater than one and less than 20.

The connection terminals 510 of the electronic component 500 may be respectively electrically connected to the pads 10-1 and 10-2 or 20-1 and 20-2 of the PCB 100. The connection terminals 510 of the electronic component 500 may be respectively electrically connected to the pads 10-1 and 10-2 or 20-1 and 20-2 of the PCB 100 by solder fillets 200b. The solder fillet 200b may cover at least a portion of a side surface of the connection terminal 510 of the electronic component 500. The solder fillet 200b may be formed by performing a reflow process on the solder layer 200a shown in FIGS. 2A to 2C. The reflow process may be performed at a temperature of, for example, about 150° C. to about 400° C.

Each of the connection terminals 510 of the electronic component 500 may be electrically connected to the PCB 100 by using the first sub-pad portion 12 or 22 and a portion of the second sub-pad portion 14 or 24 as a connection pad. In some embodiments, each of the connection terminals 510 of the electronic component 500 may be electrically connected to the PCB 100 by using the first sub-pad portion 12 or 22, a portion of the second sub-pad portion 14 or 24, and a portion of the third sub-pad portion 16 or 26 as a connection pad.

Figure 3A:
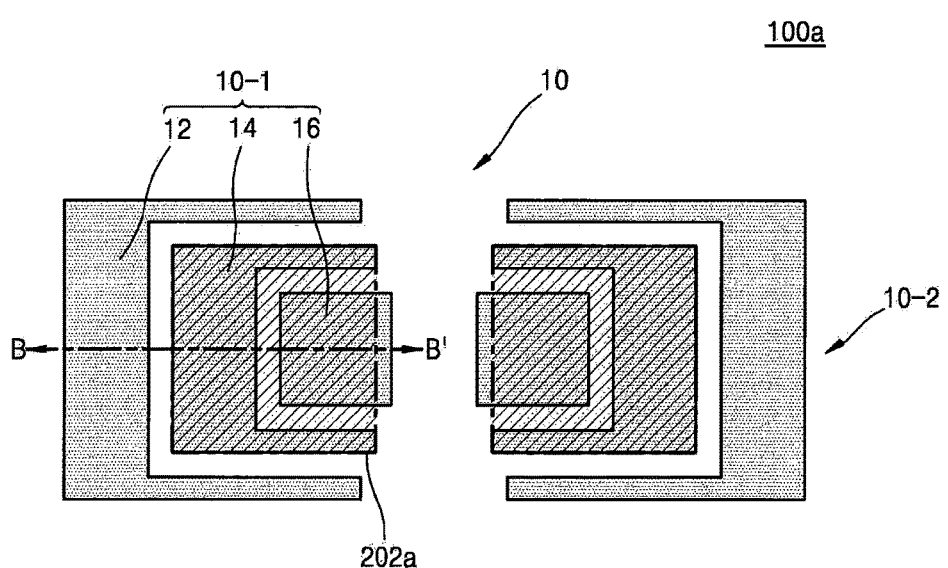
FIGS. 3A to 3C are schematic plan views and cross-sectional view of pad groups formed on PCBs according to an exemplary embodiment.
Figure 3B:
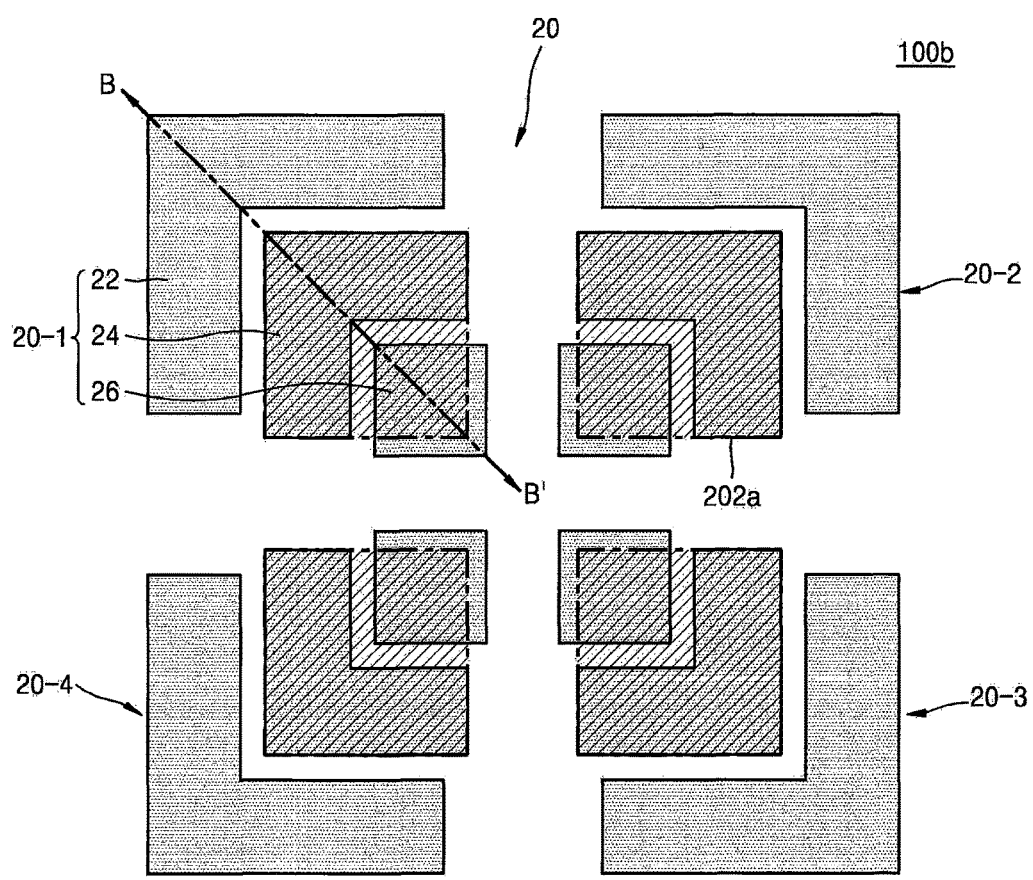
Figure 3C:
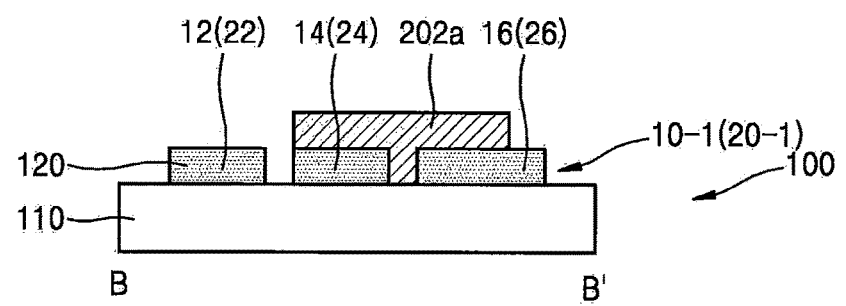
Figure 3D:
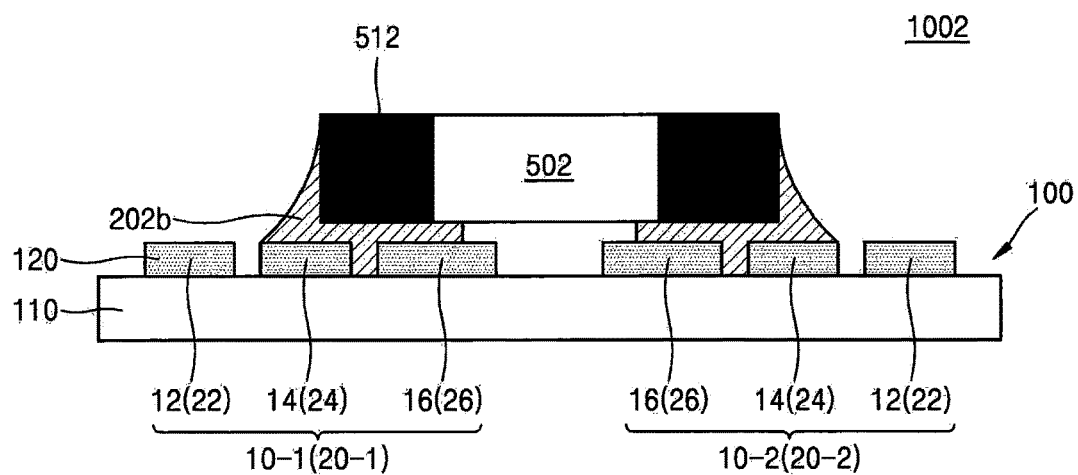
FIG. 3D is a schematic cross-sectional view of an electronic device according to an exemplary embodiment.

FIGS. 3A to 3C are schematic plan views and cross-sectional view of pad groups 10 and 20 formed on PCBs 100a and 100b according to some embodiments, and FIG. 3D is a schematic cross-sectional view of an electronic device according to an exemplary embodiment. Specifically, FIGS. 3A and 3B are plan views showing that a solder layer is formed on the PCB 100a of FIG. 1A or the PCB 100b of FIG. 1B. FIG. 3C is a schematic cross-sectional view taken along a line B-B' of FIG. 3A or FIG. 3B. FIG. 3D is a schematic cross-sectional view of an electronic device including the PCB 100a of FIG. 3A or the PCB 100b of FIG. 3B. In FIGS. 3A to 3D, the same descriptions as in FIGS. 1A to 2D may be omitted.

Referring to FIG. 3A, the PCB 100a may include a pad group 10 including a first pad 10-1 and a second pad 10-2. Each of the first and second pads 10-1 and 10-2 may include a plurality of sub-pad portions 12, 14, and 16.

A solder layer 202a may be formed on a portion of each of the first pad 10-1 and the second pad 10-2. The solder layer 202a may be formed by means of, for example, a screen printing process using a solder paste, but the inventive concepts are not limited thereto. In some embodiments, the solder paste may further include flux.

The solder layer 202a may cover the entire second sub-pad portion 14 and also cover the portion of the third sub-pad portion 16 located in the recessed portion of the second sub-pad portion 14. The solder layer 202 covering both the second sub-pad portion 14 and the portion of the third sub-pad portion 16 may also cover a space between the second and third sub-pad portions 14 and 16 so that the solder layer 202 may be integrally formed. The solder layer 202a may not cover the first sub-pad portion 12. That is, a portion in which the solder layer 202a is formed may be the connection region for the connection terminal described with reference to FIG. 1A.

Although the solder layer 202a does not have the same shape as the third sub-pad portion 16, the solder layer 202a may have a generally similar shape to the third sub-pad portion 16 and a larger size than the third sub-pad portion 16 and have a smaller area than the solder layer 200a shown in FIG. 2A. When the third sub-pad portion 16 has a tetragonal shape and the second sub-pad portion 14 has a U shape, the solder layer 202a also may have a tetragonal shape.

The solder layer 202a may not cover a portion of the third sub-pad portion 16. The solder layer 202a may not cover a portion of the third sub-pad portion 16, which may protrude from an end portion of the second sub-pad portion 14 of the first pad 10-1 toward the second pad 10-2. That is, an edge of the solder layer 202a may include a line connecting an outer edge of the second sub-pad portion 14 and the end portion of the second sub-pad portion 14.

Referring to FIG. 3B, a PCB 100b may include a pad group 20 including first to fourth pads 20-1, 20-2, 20-3, and 20-4. Each of the first to fourth pads 20-1, 20-2, 20-3, and 20-4 may include a plurality of sub-pad portions 22, 24, and 26.

A solder layer 202a may be formed on a portion of each of the first to fourth pad 20-1, 20-2, 20-3, and 20-4. The solder layer 202a may be formed by means of, for example, a screen printing process using a solder paste, but the inventive concepts are not limited thereto.

The solder layer 202a may cover the entire second sub-pad portion 24 and also cover the portion of the third sub-pad portion 26 located in the recessed portion of the second sub-pad portion 24. The solder layer 202a covering both the second sub-pad portion 24 and the portion of the third sub-pad portion 26 may also cover a space between the second and third sub-pad portions 24 and 26 so that the solder layer 202a may be integrally formed. That is, a portion in which the solder layer 202a is formed may be the connection region for the connection terminal of the electronic component described with reference to FIG. 1B.

Although the solder layer 202a does not have the same size as the third sub-pad portion 26, the solder layer 202a may have a generally similar shape to the third sub-pad portion 26 and a larger size than the third sub-pad portion 26 and have a smaller area than the solder layer 200a shown in FIG. 2B. When the third sub-pad portion 26 has a tetragonal shape and each of the second sub-pad portions 22 and 24 has an L shape, the solder layer 202a may also have a tetragonal shape.

The solder layer 202a may not cover a portion of the third sub-pad portion 26. The solder layer 202a may not cover a portion of the third sub-pad portion 26, which may protrude from an end portion of the second sub-pad portion 24 of the first pad 20-1 toward the second pad 20-2 and the fourth pad 20-4. That is, an edge of the solder layer 202a may include a line connecting an outer edge of the second sub-pad portion 24 and the end portion of the second sub-pad portion 24.

Referring to FIG. 3C, a PCB 100 may include a substrate base 110 and a conductive pattern layer 120 formed on a surface of the substrate base 110.

A portion of the conductive pattern layer 120 may be the first pad 10-1 or 20-1 including the first sub-pad portion 12 or 22, the second sub-pad portion 14 or 24, and the third sub-pad portion 16 or 26. Although FIG. 3C illustrates only a portion of the conductive pattern layer 120, which constitutes the first pad 10-1 or 20-1, a portion of the conductive pattern layer 120 other than the first pad 10-1 or 20-1 may be further formed on the surface of the substrate base 110. Although FIG. 3C illustrates only a cross-section of the first pad 10-1 or 20-1, each of the second pad 10-2 or 20-2, the third pad 20-3, and the fourth pad 20-4 shown in FIG. 3A or FIG. 3B may have the same sectional shape as the first pad 10-1 or 20-1.

A solder layer 202a may be formed on the second sub-pad portion 14 or 24 and the third sub-pad portion 16 or 26. The solder layer 202a may also be formed on the substrate base 110 between the second sub-pad portion 14 or 24 and the third sub-pad portion 16 or 26.

Referring to FIG. 3D, an electronic device 1002 may include an electronic component 502 mounted on the PCB 100. The PCB 100 may include a substrate base 110 and at least two pads 10-1 and 10-2 or 20-1 and 20-2, which may be formed on a surface of the substrate base 110 and constitute a portion of a conductive pattern layer 120.

The electronic component 502 may be an active device or a passive device, such as a resistor, a capacitor, an inductor, a switch, a temperature sensor, a DC-DC converter, or a quartz or voltage regulator configured to generate a clock. Alternatively, the electronic component 502 may be a semiconductor device, such as a diode or a transistor. Alternatively, the electronic component 502 may be an IC having a relatively small number of connection terminals. The electronic component 502 may have at least two connection terminals 512. The electronic component 502 may have, for example, n connection terminals 512 (here, n is an integer equal to or more than 2 and less than 20).

The electronic component 502 shown in FIG. 3D may have a size (e.g., an area on a surface parallel to a main surface of the substrate 110) smaller than that of the electronic component 500 shown in FIG. 2D.

The connection terminals 512 of the electronic component 502 may be respectively electrically connected to the pads 10-1 and 10-2 or 20-1 and 20-2 of the PCB 100. The connection terminals 512 of the electronic component 502 may be respectively electrically connected to the pads 10-1 and 10-2 or 20-1 and 20-2 of the PCB 100 by solder fillets 202b. The solder fillet 202b may cover at least a portion of a side surface of the connection terminal 512 of the electronic component 502. The solder fillet 202b may be formed by performing a reflow process on the solder layer 202a shown in FIG. 3A to 3C.

Each of the connection terminals 512 of the electronic component 502 may be electrically connected to the PCB 100 by using the second sub-pad portion 14 or 24 and a portion of the third sub-pad portion 16 or 26 as a connection pad.

Figure 4A:
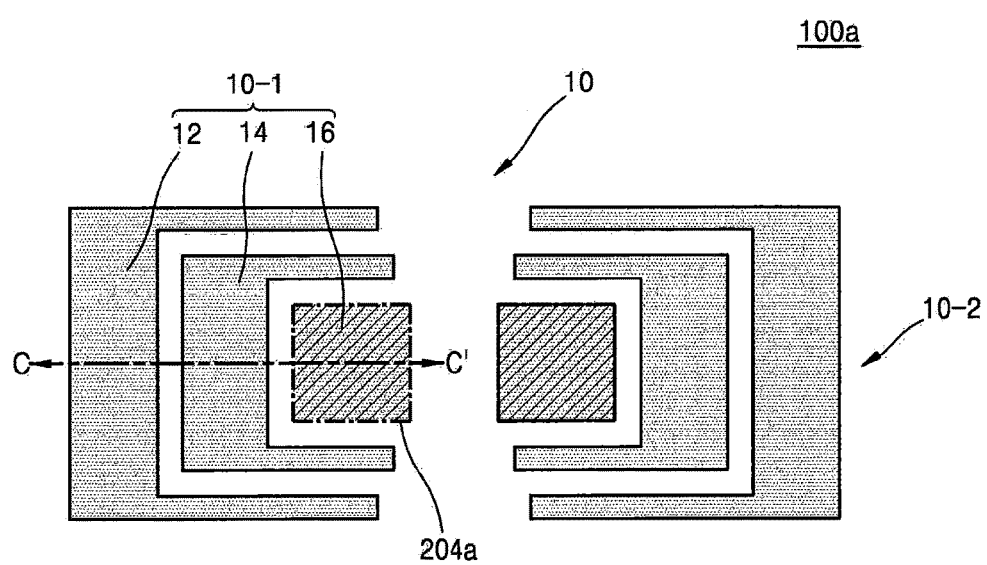
FIGS. 4A to 4C are schematic plan views and cross-sectional view of pad groups formed on PCBs according to some embodiments.
Figure 4B:
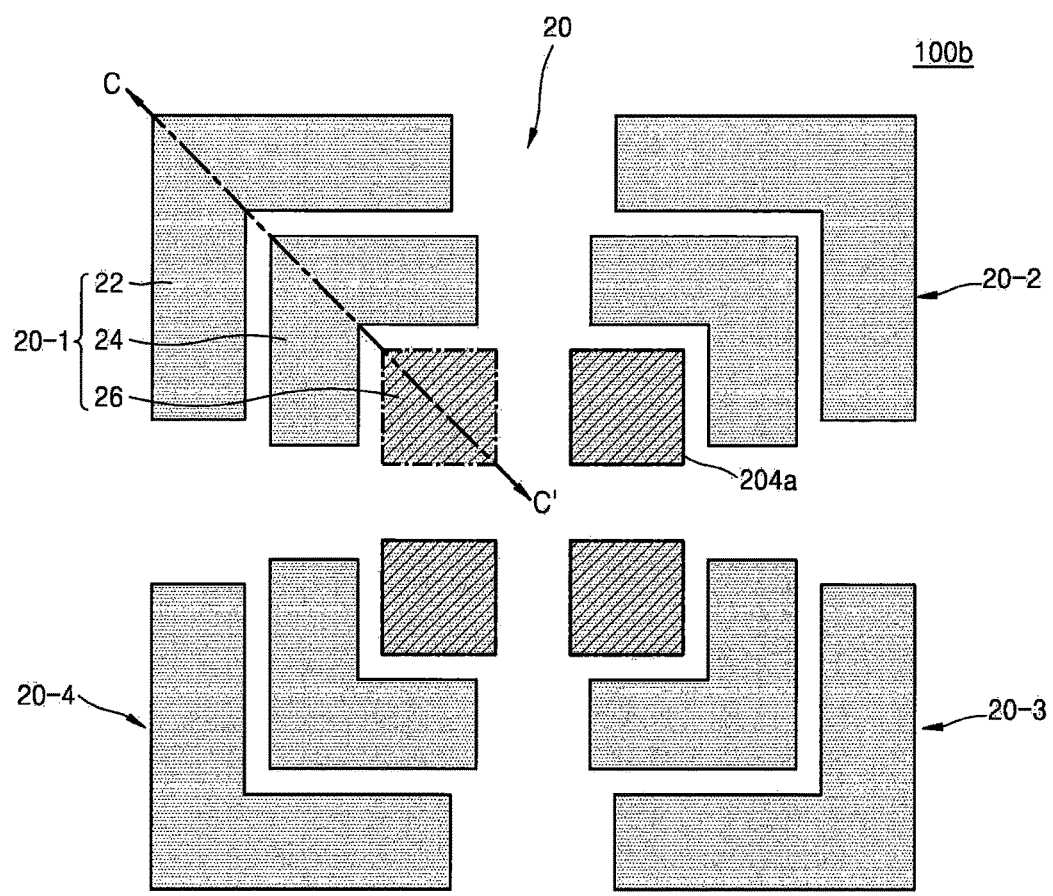
Figure 4C:
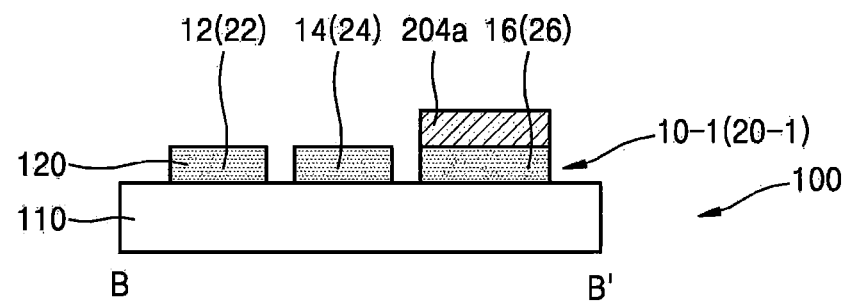
Figure 4D:
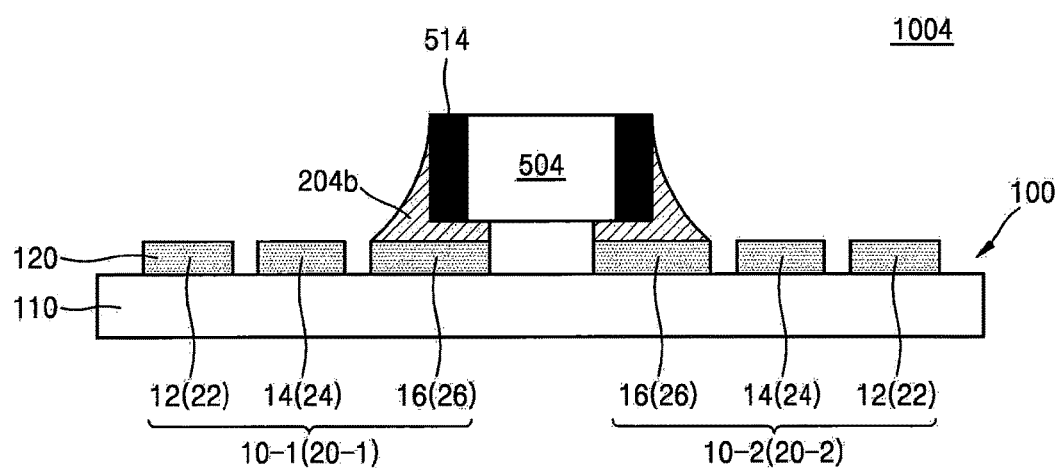
FIG. 4D is a schematic cross-sectional view of an electronic device according to an exemplary embodiment.

FIGS. 4A to 4C are schematic plan views and cross-sectional view of pad groups formed on PCBs according to some embodiments, and FIG. 4D is a schematic cross-sectional view of an electronic device according to an exemplary embodiment. Specifically, FIGS. 4A and 4B are plan views showing that a solder layer is formed on the PCB 100a of FIG. 1A or the PCB 100b of FIG. 1B. FIG. 4C is a schematic cross-sectional view taken along a line C-C' of FIG. 4A or FIG. 4B. FIG. 4D is a schematic cross-sectional view of an electronic device including the PCB 100a of FIG. 4A or the PCB 100b of FIG. 4B. In FIGS. 4A to 4D, the same descriptions as in FIG. 1A to 3D may be omitted.

Referring to FIG. 4A, the PCB 100a may include a pad group 10 including a first pad 10-1 and a second pad 10-2. Each of the first and second pads 10-1 and 10-2 may include a plurality of sub-pad portions 12, 14, and 16.

A solder layer 204a may be formed on a portion of each of the first pad 10-1 and the second pad 10-2. The solder layer 204a may be formed by means of, for example, a screen printing process using a solder paste, but the inventive concepts are not limited thereto. In some embodiments, the solder paste may further include flux.

The solder layer 204a may cover the third sub-pad portion 16. For example, the solder layer 204a may cover the entire third sub-pad portion 16. The solder layer 204a may not cover the first sub-pad portion 12 and the second sub-pad portion 14. That is, a portion in which the solder layer 204a is formed may be a connection region for connection terminals of the electronic component described with reference to FIG. 1A.

A shape of the solder layer 204a may be the same as or similar to a shape of the third sub-pad portion 16. The solder layer 204a may have a smaller area than the solder layer 200a shown in FIG. 2A or the solder layer 202a shown in FIG. 3A. When the third sub-pad portion 16 has a tetragonal shape, the solder layer 204a also may have a tetragonal shape.

Referring to FIG. 4B, a PCB 100b may include a pad group 20 including first to fourth pads 20-1, 20-2, 20-3, and 20-4. Each of the first to fourth pads 20-1, 20-2, 20-3, and 20-4 may include a plurality of sub-pad portions, first to third sub-pad portions 22, 24, and 26.

A solder layer 204a may be formed on a portion of each of the first to fourth pads 20-1, 20-2, 20-3, and 20-4. The solder layer 204a may be formed by means of, for example, a screen printing process using a solder paste, but the inventive concepts are not limited thereto.

The solder layer 204a may cover the third sub-pad portion 26. For example, the solder layer 204a may cover the entire third sub-pad portion 26. The solder layer 204a may not cover the first sub-pad portion 22 and the second sub-pad portion 24. That is, a portion in which the solder layer 204a is formed may be a connection region for connection terminals of the electronic component described with reference to FIG. 1B.

A shape of the solder layer 204a may be the same as or similar to a shape of the third sub-pad portion 26. The solder layer 204a may have a smaller area than the solder layer 200a shown in FIG. 2B and the solder layer 202a shown in FIG. 3B. When the third sub-pad portion 26 has a tetragonal shape, the solder layer 204a also may have a tetragonal shape.

Referring to FIG. 4C, a PCB 100 may have a substrate base 110 and a conductive pattern layer 120 formed on a surface of the substrate base 110.

A portion of the conductive pattern layer 120 may be the first pad 10-1 or 20-1 including the first sub-pad portion 12 or 22, the second sub-pad portion 14 or 24, and the third sub-pad portion 16 or 26. FIG. 4C illustrates only the portion of the conductive pattern layer 120, which constitutes the first pad 10-1 or 20-1, but another portion of the conductive pattern 120 except the first pad 10-1 or 20-1 may be further formed on a surface of the substrate base 110. Although FIG. 4C illustrates only a cross-section of the first pad 10-1 or 20-1, each of the second pad 20-2, the third pad 20-3, and the fourth pad 20-4 shown in FIG. 4A or FIG. 4B may have the same sectional shape as the first pad 10-1 or 20-1.

The solder layer 204a may be formed on the third sub-pad portion 16 or 26.

Referring to FIG. 4D, an electronic device 1004 may include an electronic component 504 mounted on the PCB 100. The PCB 100 may include a substrate base 110 and at least two pads 10-1 and 10-2 or 20-1 and 20-2, which may constitute a portion of the conductive pattern layer 120 formed on the surface of the substrate base 110.

The electronic component 504 may be an active device or a passive device, such as a resistor, a capacitor, an inductor, a switch, a temperature sensor, a direct current-direct current (DC-DC) converter, or a quartz or voltage regulator configured to generate a clock. Alternatively, the electronic component 504 may be a semiconductor device, such as a diode or a transistor. Alternatively, the electronic component 504 may be an IC having a relatively small number of connection terminals. The electronic component 504 may have at least two connection terminals 514. The electronic component 504 may have, for example, n connection terminals 514, where n is an integer greater than one and less than 20.

The electronic component 504 shown in FIG. 4D may have a size (e.g., an area on a surface parallel to a main surface of the substrate base 110) smaller than those of the electronic component 500 shown in FIG. 2D and the electronic component 502 shown in FIG. 3D.

The connection terminals 514 of the electronic component 504 may be respectively electrically connected to the pads 10-1 and 10-2 or 20-1 and 20-2 of the PCB 100. The connection terminals 514 of the electronic component 504 may be respectively electrically connected to the pads 10-1 and 10-2 or 20-1 and 20-2 of the PCB 100 by solder fillets 204b. The solder fillet 204b may cover at least a portion of a side surface of the connection terminal 514 of the electronic component 504. The solder fillet 204b may be formed by performing a reflow process on the solder layer 204a shown in FIG. 4A to 4C.

Each of the connection terminals 514 of the electronic component 504 may be electrically connected to the PCB 100 by using the third sub-pad portion 16 or 26 as a connection pad.

Referring to FIGS. 2D, 3D, and 4D, the electronic devices 1000, 1002, and 1004 may be formed by mounting the electronic components 500, 502, and 504 having different sizes on homogenous PCBs 100 on which the pads 10-1 and 10-2 or 20-1 and 20-2 having the same shape are formed.

The electronic component 500 shown in FIG. 2D, the electronic component 502 shown in FIG. 3D, and the electronic component 504 shown in FIG. 4D mounted on the pads 10-1 and 10-2 or 20-1 and 20-2 having the same shape may be homogenous electronic components. Alternatively, the electronic component 500 shown in FIG. 2D, the electronic component 502 shown in FIG. 3D, and the electronic component 504 shown in FIG. 4D may be homogenous electronic components having different characteristics (i.e., specifications). For example, when the electronic components 500, 502, and 504 are resistors or capacitors, the electronic component 500 shown in FIG. 2D, the electronic component 502 shown in FIG. 3D, and the electronic component 504 shown in FIG. 4D may have different resistances or capacitances, different operating voltages, or different power capacities. For example, when the electronic components 500, 502, and 504 are quartz configured to generate clocks, the electronic component 500 shown in FIG. 2D, the electronic component 502 shown in FIG. 3D, and the electronic component 504 shown in FIG. 4D may generate clocks having different frequencies.

In a process of manufacturing an electronic device, when some electronic components are replaced with other to vary characteristics of the electronic device, ensure reliability, or improve performance, when the sizes of replacement electronic components are different from those of the original electronic components, it may be necessary to manufacture a new PCB by changing the design of the PCB. Thus, additional costs may be incurred, and production of the electronic device may be delayed. In particular, when new PCBs for mass-produced products are to be manufactured, PCBs which have already been manufactured may be all discarded, thus causing large-scaled loss.

However, in the PCB 100 according to the present embodiment, the electronic components 500, 502, and 504 having different sizes may be mounted on the pads 10-1 and 10-2 or 20-1 and 20-2 having the same shape by changing only the area of the solder layer (refer to 200a of FIGS. 2A to 2C, 202a of FIGS. 3A to 3C, and 204a of FIGS. 4A to 4C). In particular, the area of the solder layer 200a, 202a, or 204a may be changed at relatively low cost in a relatively short amount of time. Thus, incurrence of additional costs and a delay in production may be minimized without manufacturing a new PCB 100.

In addition, since the first sub-pad portion 12 or 22, the second sub-pad portion 14 or 24, and the third sub-pad portion 16 or 26 are spaced apart from one another or substantially separate from one another, even if solder layers 200a, 202a, and 204a having different areas are applied according to the sizes of the electronic components 500, 502, and 504, solder fillets 200b, 202b, and 204b may be formed so as to sufficiently cover the side surfaces of the connection terminals 510, 512, and 514 of the electronic components 500, 502, and 504.

Figure 5A:
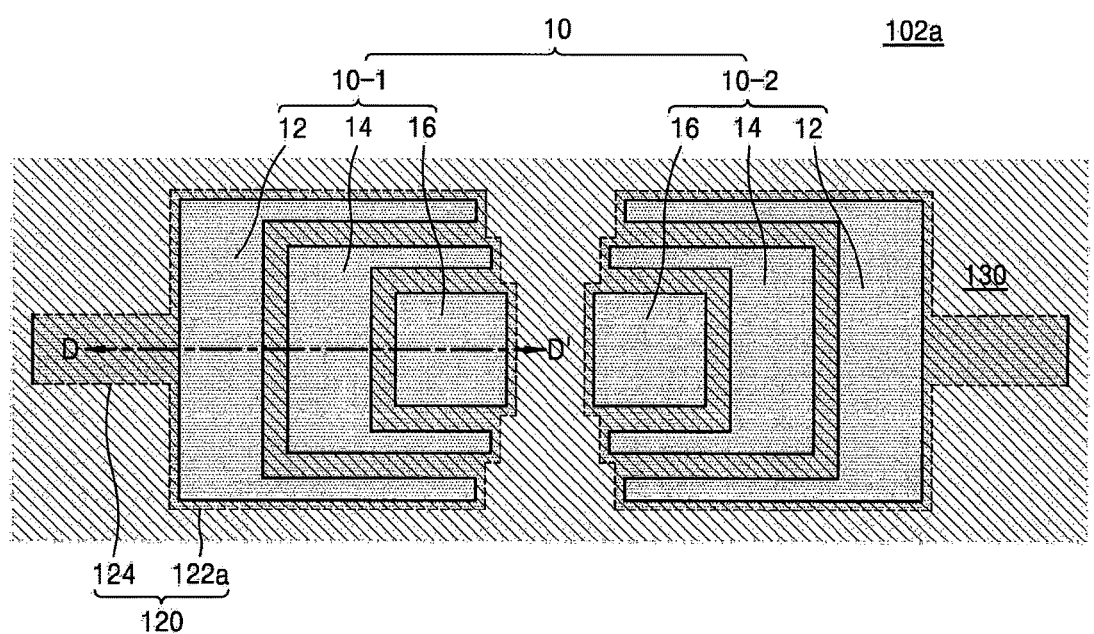
FIGS. 5A to 5C are schematic plan views and cross-sectional view of connection relationships between sub-pad portions included in pad groups formed on PCBs according to some embodiments.
Figure 5B:
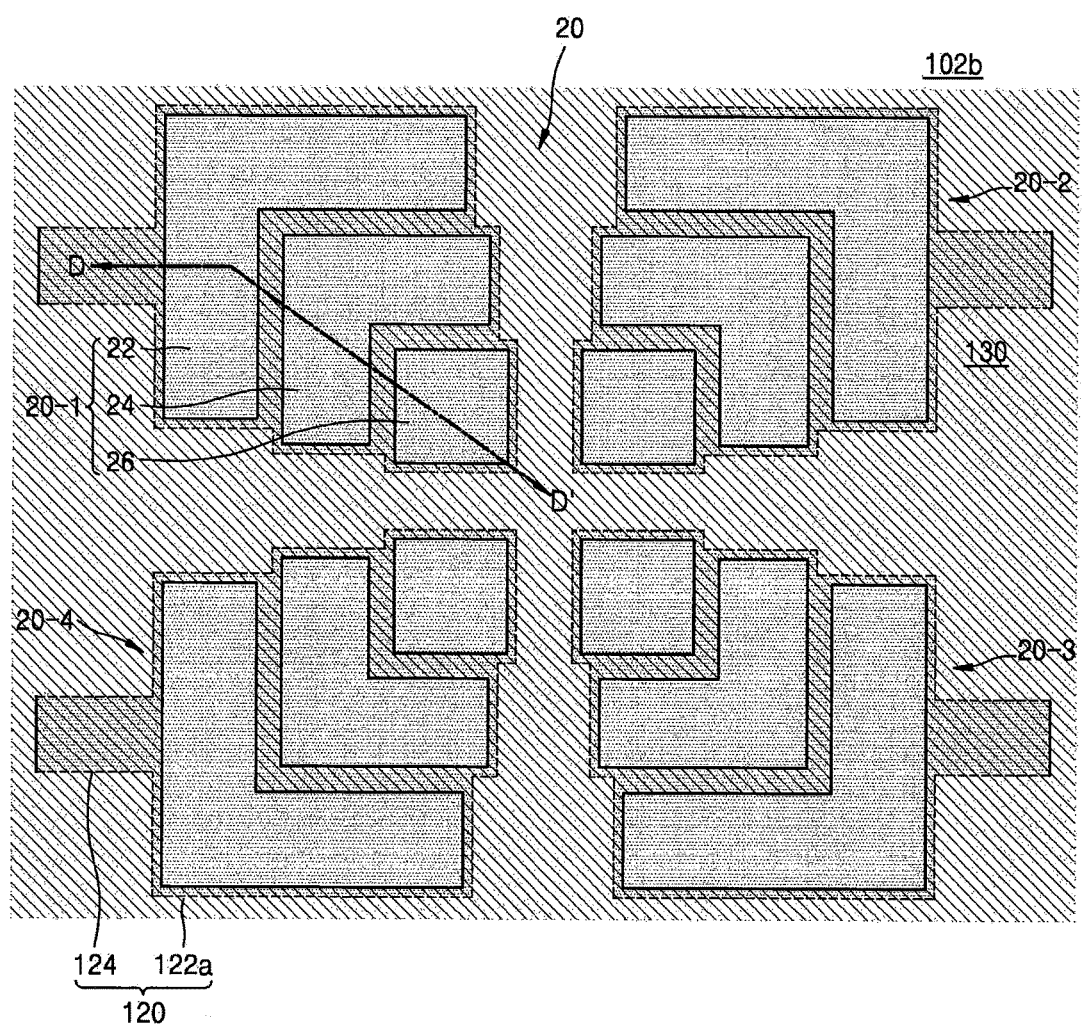
Figure 5C:
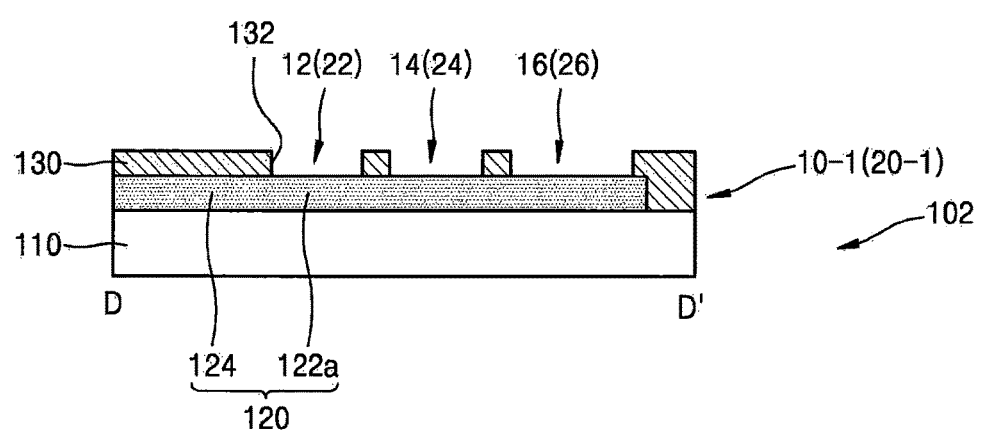

FIGS. 5A to 5C are schematic plan views and cross-sectional view of connection relationships between sub-pad portions included in pad groups formed on PCBs according to some embodiments. Specifically, FIG. 5C is a schematic cross-sectional view taken along a line D-D' of FIG. 5A or FIG. 5B.

Referring to FIG. 5A, the PCB 102a may include a pad group 10 including a first pad 10-1 and a second pad 10-2. Each of the first and second pads 10-1 and 10-2 may include a plurality of sub-pad portions, for example, first to third sub-pad portions 12, 14, and 16.

The first to third sub-pad portions 12, 14, and 16 included in the first pad 10-1 or the second pad 10-2 may be integrally formed and become a portion of the conductive pattern 122a. Accordingly, all the first to third sub-pad portions 12, 14, and 16 included in the first pad 10-1 or the second pad 10-2 may be electrically connected to one another. The conductive pattern 122a may be connected to an interconnection pattern 124. The interconnection pattern 124 may electrically connect the first pad 10-1 or the second pad 10-2 with another member located on the PCB 102a. The interconnection pattern 124 may extend from the conductive pattern 122a. The conductive pattern 122a and the interconnection pattern 124 may be integrally formed and become a portion of the conductive pattern layer 120.

A portion of the conductive pattern layer 120 may be covered with a solder resist layer 130. The solder resist layer 130 may cover a portion of the conductive pattern 122a and cover the entire interconnection pattern 124. The solder resist layer 130 may have an opening (refer to 132 in FIG. 5C). Portions of the conductive pattern 122a exposed by the opening 132 of the solder resist layer 130 may be the first to third sub-pad portions 12, 14, and 16. That is, the solder resist layer 130 may expose the first to third sub-pad portions 12, 14, and 16 and cover the portions of the conductive pattern 122a to surround the first to third sub-pad portions 12, 14, and 16.

Referring to FIG. 5B, a PCB 102b may include a pad group 20 including first to fourth pads 20-1, 20-2, 20-3, and 20-4. Each of the first to fourth pads 20-1, 20-2, 20-3, and 20-4 may include a plurality of sub-pad portions, for example, first to third sub-pad portions 22, 24, and 26.

The first to third sub-pad portions 22, 24, and 26 included in the first pad 20-1 may be integrally formed and become a portion of the conductive pattern 122a. Accordingly, all the first to third sub-pad portions 22, 24, and 26 included in the first pad 20-1 may be electrically connected to one another. The conductive pattern 122a may be connected to an interconnection pattern 124. The interconnection pattern 124 may electrically connect the first pad 20-1 with another member located on the PCB 102b. The interconnection pattern 124 may extend from the conductive pattern 122a. The conductive pattern 122a and the interconnection pattern 124 may be integrally formed and become a portion of the conductive pattern layer 120.

A portion of the conductive pattern layer 120 may be covered with a solder resist layer 130. The solder resist layer 130 may cover a portion of the conductive pattern 122a and the entire interconnection pattern 124. Portions of the conductive pattern 122a exposed by the opening (refer to 132 in FIG. 5C) formed in the solder resist layer 130 may be the first to third sub-pad portions 22, 24, and 26. That is, the solder resist layer 130 may expose the first to third sub-pad portions 22, 24, and 26, cover a portion of the conductive pattern 122a, and surround the first to third sub-pad portions 22, 24, and 26.

Referring to FIG. 5C, a PCB 102 may include a substrate base 110 and a conductive pattern layer 120 formed on a surface of the substrate base 110. A portion of the conductive pattern layer 120 may be a conductive pattern 122a, and another portion of the conductive pattern layer 120 may be an interconnection pattern 124. The interconnection pattern 124 may extend from the conductive pattern 122a. The conductive pattern 122a and the interconnection pattern 124 may be portions of the conductive pattern layer 120, which are integrally formed and are at the same level as a main surface of the substrate base 110.

A portion of the conductive pattern layer 120 may be covered with a solder resist layer 130. The solder resist layer 130 may cover a portion of the conductive pattern 122a and the entire interconnection pattern 124. The solder resist layer 130 may have an opening 132. Portions of the conductive pattern 122a exposed by the opening 132 of the solder resist layer 130 may be the first sub-pad portion 12 or 22, the second sub-pad portion 14 or 24, and the third sub-pad portion 16 or 26. That is, the first sub-pad portion 12 or 22, the second sub-pad portion 14 or 24, and the third sub-pad portion 16 or 26 included in the first pad 10-1 or 20-1 may be portions of the conductive pattern 122a, which are integrally formed and are at the same level as a main surface of the substrate base 110.

The portions of the conductive pattern 122a exposed by the opening 132 of the solder resist layer 130 may be the first sub-pad portion 12 or 22, the second sub-pad portion 14 or 24, and the third sub-pad portion 16 or 26 included in the first pad 10-1 or 20-1. That is, the solder resist layer 130 may expose the first sub-pad portion 12 or 22, the second sub-pad portion 14 or 24, and the third sub-pad portion 16 or 26, cover portions of the conductive pattern 122a, and surround the first sub-pad portion 12 or 22, the second sub-pad portion 14 or 24, and the third sub-pad portion 16 or 26.

Figure 6A:
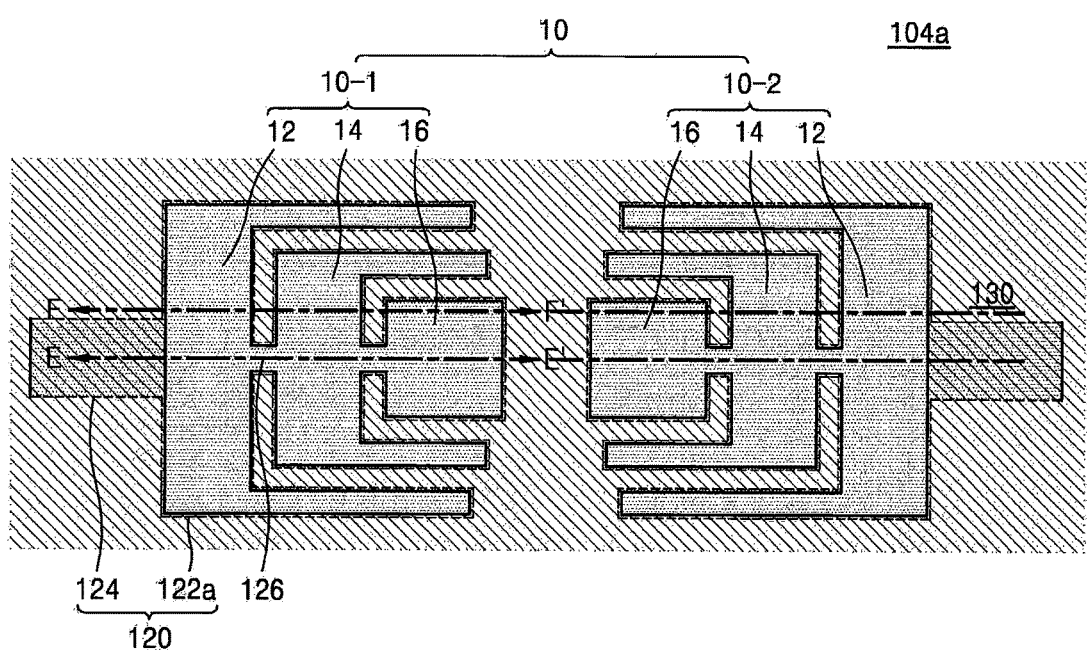
FIGS. 6A to 6D are schematic plan views and cross-sectional views of connection relationships between sub-pad portions included in pad groups formed on PCBs according to some embodiments.
Figure 6B:
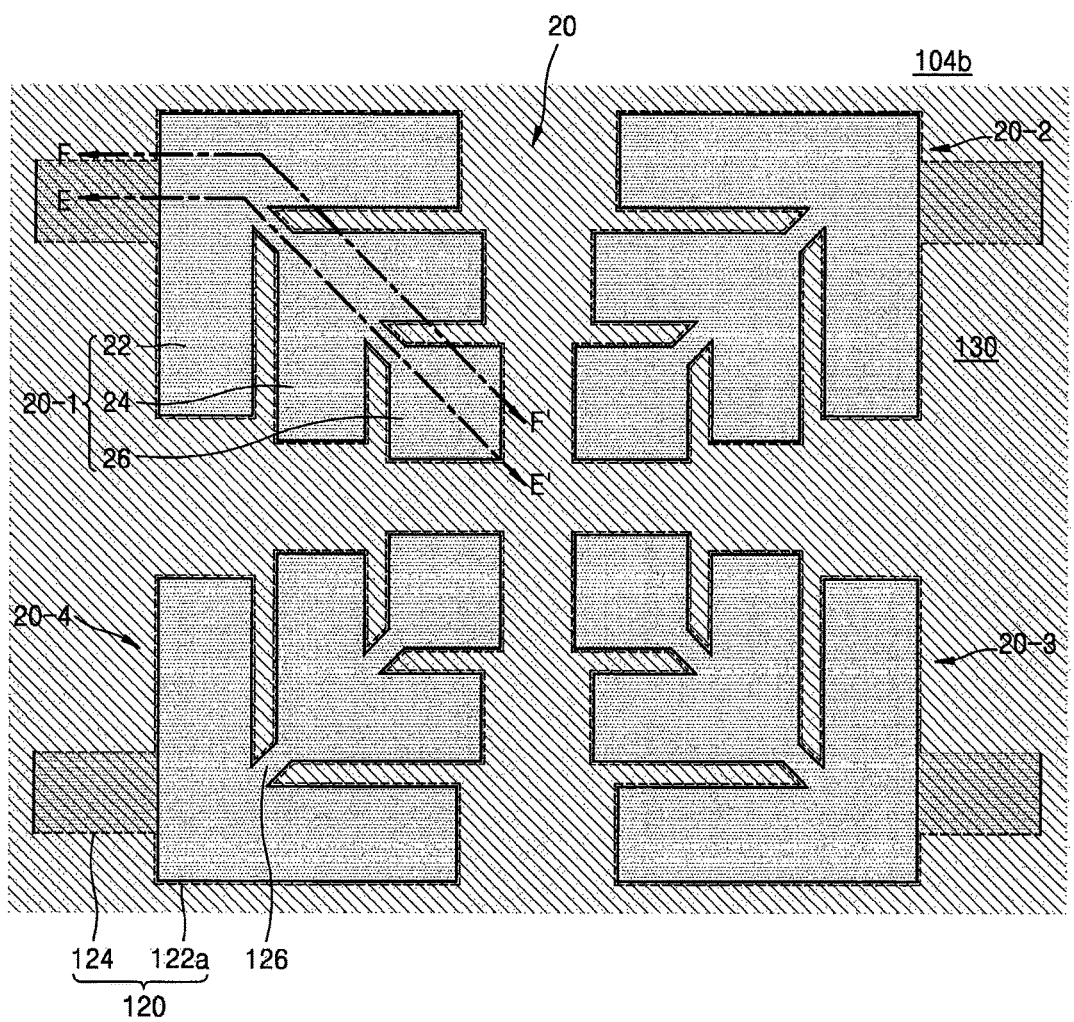
Figure 6C:
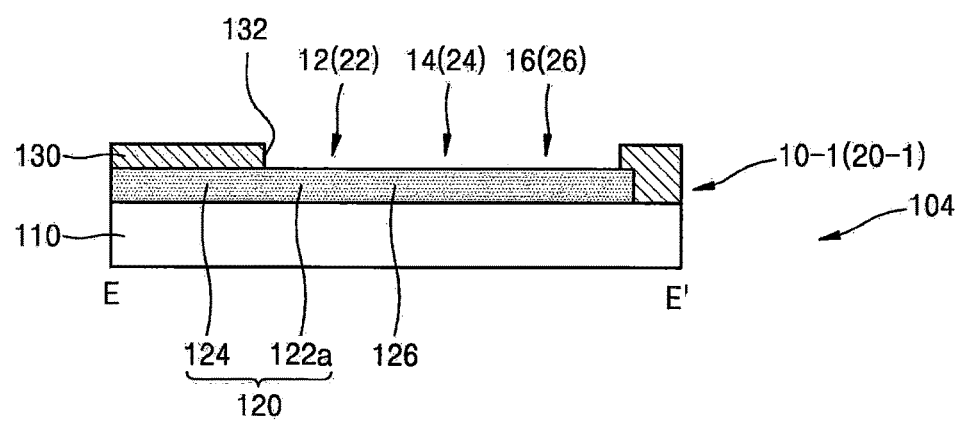
Figure 6D:
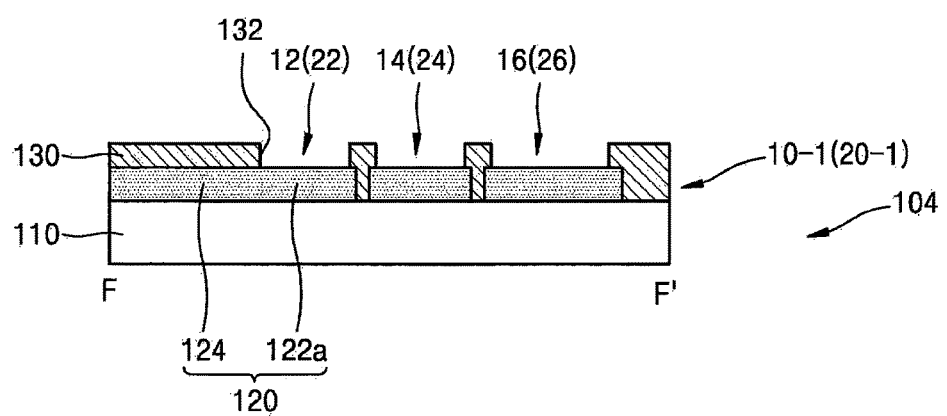

FIGS. 6A to 6D are schematic plan views and cross-sectional views of connection relationships between sub-pad portions included in pad groups formed on PCBs according to some embodiments. Specifically, FIG. 6C is a schematic cross-sectional view taken along a line E-E' of FIG. 6A or FIG. 6B, and FIG. 6D is a schematic cross-sectional view taken along a line F-F' of FIG. 6A or FIG. 6B.

Referring to FIG. 6A, a PCB 104a may include a pad group 10 including a first pad 10-1 and a second pad 10-2. Each of the first and second pads 10-1 and 10-2 may include a plurality of sub-pad portions, for example, first to third sub-pad portion 12, 14, and 16.

The first to third sub-pad portions 12, 14, and 16 included in the first pad 10-1 or the second pad 10-2 may be portions of the conductive pattern 122a which is integrally formed. Accordingly, all the first to third sub-pad portions 12, 14, and 16 of the first pad 10-1 or the second pad 10-2 may be electrically connected to one another. The conductive pattern 122a may further include a connection bridge 126. The first to third sub-pad portions 12, 14, and 16 may be connected to one another by the connection bridge 126. Specifically, the connection bridge 126 may be located between the first sub-pad portion 12 and the second sub-pad portion 14 and between the second sub-pad portion 14 and the third sub-pad portion 16 so that the first sub-pad portion 12 may be electrically connected to the second sub-pad portion 14 and the second sub-pad portion 14 may be electrically connected to the third sub-pad portion 16. The first to third sub-pad portions 12, 14, and 16 and the connection bridge 126 may be portions of the conductive pattern 122a which is integrally formed. The connection bridge 126 may be formed in relatively small portions of a space between the first sub-pad portion 12 and the second sub-pad portion 14 and a space between the second sub-pad portion 14 and the third sub-pad portion 16 so that the first to third sub-pad portions 12, 14, and 16 may be substantially separate from one another. For example, during the process of forming the solder fillets 202b and 204b as shown in FIG. 3D or 4D, the connection bridge 126 may prevent or minimize the flow of a portion of the reflowed solder layer (refer to 202a of FIGS. 3A to 3C and 204a of FIGS. 4A to 4C) into the first sub-pad portion 12 or the second sub-pad portion 14 so that the solder fillets 202b and 204b may sufficiently cover the side surfaces of the connection terminals 512 and 514 of the electronic components 502 and 504.

The conductive pattern 122a may be connected to an interconnection pattern 124. The interconnection pattern 124 may electrically connect the first pad 10-1 or the second pad 10-2 with another member located on the PCB 102a. The interconnection pattern 124 may extend from the conductive pattern 122a. The interconnection pattern 124 may extend from the first sub-pad portion 12. The conductive pattern 122*a* and the interconnection pattern 124 may be portions of the conductive pattern layer 120 which is integrally formed.

A portion of the conductive pattern layer 120 may be covered with a solder resist layer 130. The solder resist layer 130 may cover the entire interconnection pattern 124. In some embodiments, the solder resist layer 130 may cover a partial edge of the conductive pattern 122*a*. The first to third sub-pad portions 12, 14, and 16 may be exposed by the opening (refer to 132 in FIG. 6C) of the solder resist layer 130. A portion of the connection bridge 126 may be exposed by the opening 132 of the solder resist layer 130. In some embodiments, the connection bridge 126 may be wholly covered with the solder resist layer 130.

Referring to FIG. 6B, a PCB 104*b* may include a pad group 20 including first to fourth pads 20-1, 20-2, 20-3, and 20-4. Each of the first to fourth pads 20-1, 20-2, 20-3, and 20-4 may include a plurality of sub-pad portions, for example, first to third sub-pad portions 22, 24, and 26.

The first to third sub-pad portions 22, 24, and 26 included in the first pad 20-1 may be portions of the conductive pattern 122*a* which is integrally formed. Accordingly, all the first to third sub-pad portions 22, 24, and 26 of the first pad 20-1 may be electrically connected to one another. The conductive pattern 122*a* may further include a connection bridge 126. The first to third sub-pad portions 22, 24, and 26 may be connected to one another by the connection bridge 126. Specifically, the connection bridge 126 may be located between the first sub-pad portion 22 and the second sub-pad portion 24 and between the second sub-pad portion 24 and the third sub-pad portion 26 so that the first sub-pad portion 22 may be electrically connected to the second sub-pad portion 24 and the second sub-pad portion 24 may be electrically connected to the third sub-pad portion 26. The first to third sub-pad portions 22, 24, and 26 and the connection bridge 126 may be portions of the conductive pattern 122*a* which is integrally formed.

The conductive pattern 122*a* may be connected to an interconnection pattern 124. The interconnection pattern 124 may electrically connect the first pad 20-1 with another member located on the PCB 104*b*. The interconnection pattern 124 may extend from the conductive pattern 122*a*. The interconnection pattern 124 may extend from the first sub-pad portion 22. The conductive pattern 122*a* and the interconnection pattern 124 may be portions of the conductive pattern layer 120 which is integrally formed.

A portion of the conductive pattern layer 120 may be covered with a solder resist layer 130. The solder resist layer 130 may cover the entire interconnection pattern 124. In some embodiments, the solder resist layer 130 may cover a partial edge of the conductive pattern 122*a*. The first to third sub-pad portions 22, 24, and 26 may be exposed by an opening (refer to 132 in FIG. 6C) of the solder resist layer 130. A portion of the connection bridge 126 may be exposed by the opening 132 of the solder resist layer 130. In some embodiments, the connection bridge 126 may be wholly covered with the solder resist layer 130.

Referring to FIGS. 6C and 6D, a PCB 104 may include a substrate base 110 and a conductive pattern layer 120 formed on a surface of the substrate base 110. A portion of the conductive pattern layer 120 may be a conductive pattern 122*a*, and another portion of the conductive pattern layer 120 may be an interconnection pattern 124. The interconnection pattern 124 may extend from the conductive pattern 122*a*. The interconnection pattern 124 may extend from the first sub-pad portion 12 or 22. The conductive pattern 122*a* and the interconnection pattern 124 may be portions of the conductive pattern layer 120, which are integrally formed and are at the same level as a main surface of the substrate base 110.

A portion of the conductive pattern layer 120 may be covered with a solder resist layer 130. The solder resist layer 130 may cover the entire interconnection pattern 124. In some embodiments, the solder resist layer 130 may cover a partial edge of the conductive pattern 122*a*. The solder resist layer 130 may have an opening 132. The first sub-pad portion 12 or 22, the second sub-pad portion 14 or 24, and the third sub-pad portion 16 or 26 may be exposed by an opening 132 of the solder resist layer 130. A portion of the connection bridge 126 may be exposed by the opening 132 of the solder resist layer 130. In some embodiments, the connection bridge 126 may be wholly covered by the solder resist layer 130.

Figure 7A:
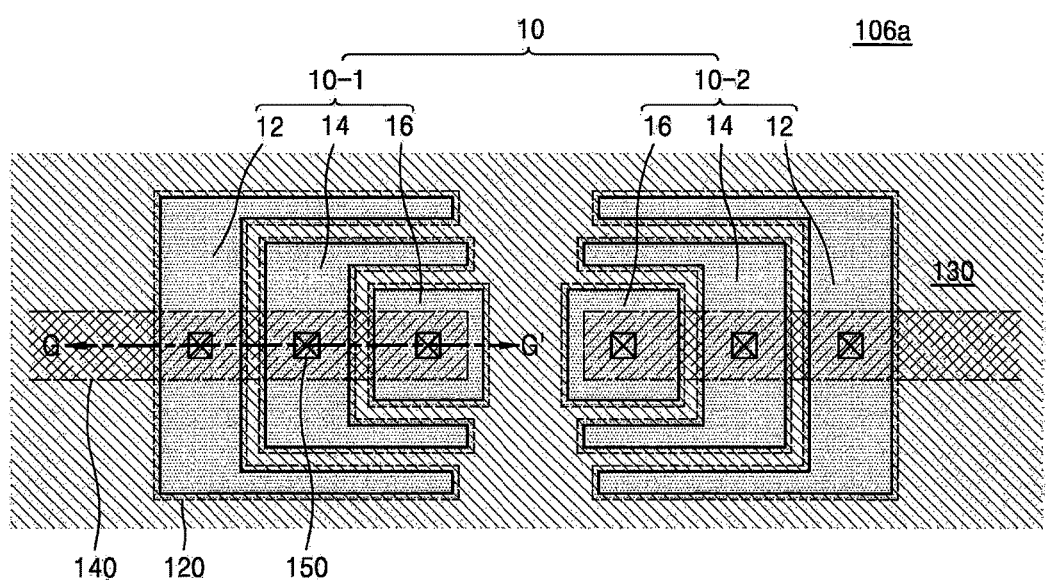
FIGS. 7A to 7C are schematic plan views and cross-sectional view of connection relationships between sub-pad portions included in pad groups formed on PCBs according to some embodiments.
Figure 7B:
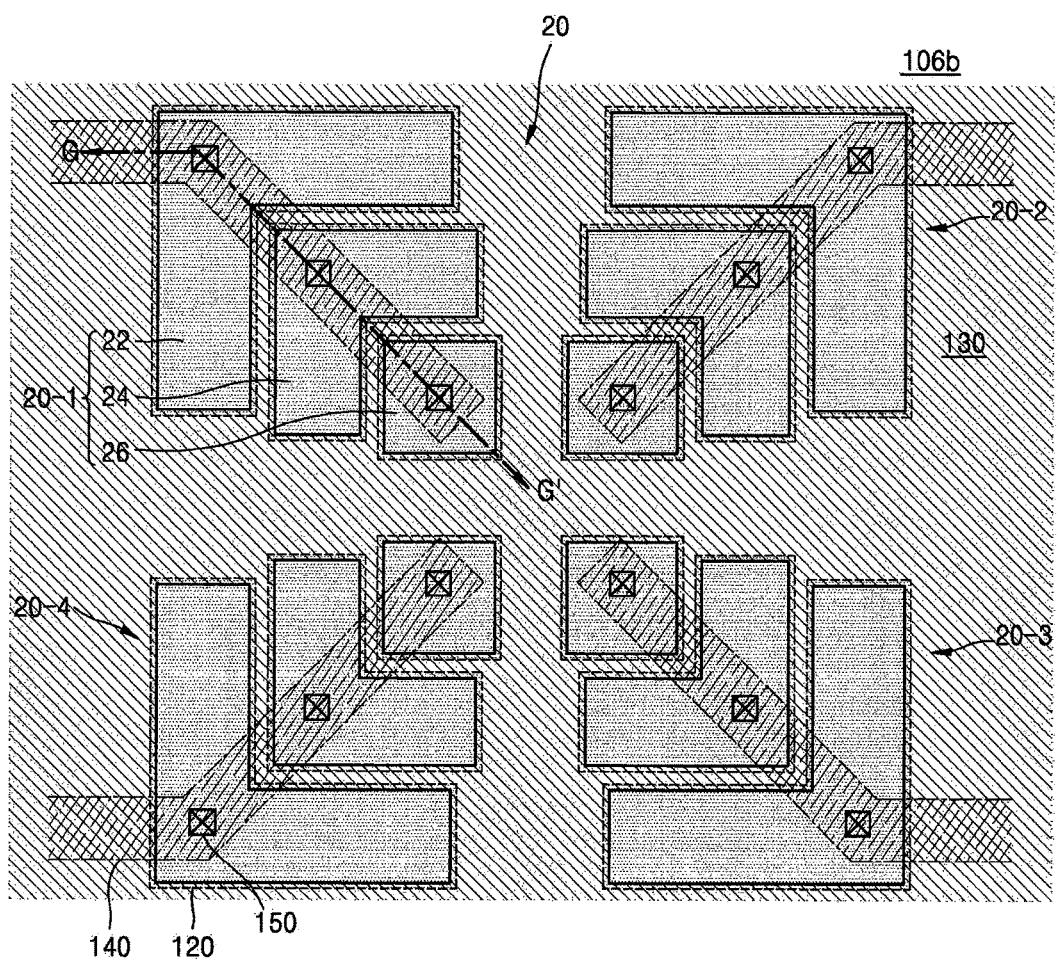
Figure 7C:
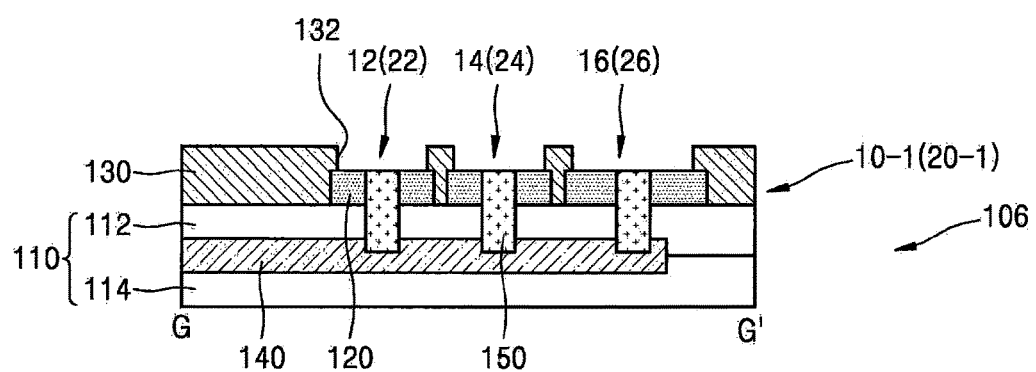

FIGS. 7A to 7C are schematic plan views and cross-sectional view of connection relationships between sub-pad portions included in pad groups formed on PCBs according to some embodiments. Specifically, FIG. 7C is a schematic cross-sectional view taken along a line G-G' of FIG. 7A or FIG. 7B.

Referring to FIG. 7A, a PCB 106*a* may be a pad group 10 including a first pad 10-1 and a second pad 10-2. Each of the first and second pads 10-1 and 10-2 may include a plurality of sub-pad portions, for example, first to third sub-pad portions 12, 14, and 16.

The first to third sub-pad portions 12, 14, and 16 included in the first pad 10-1 or the second pad 10-2 may be spaced apart from one another.

The first to third sub-pad portions 12, 14, and 16 may be electrically connected to one another by a buried conductive layer 140. A conductive via 150 may be located between each of the first to third sub-pad portions 12, 14, and 16 and the buried conductive layer 140. Each of the first to third sub-pad portions 12, 14, and 16 may be electrically connected to the buried conductive layer 140 by the conductive via 150.

Referring to FIG. 7B, a PCB 106*b* may include a pad group 20 including first to fourth pads 20-1, 20-2, 20-3, and 20-4. Each of the first to fourth pads 20-1, 20-2, 20-3, and 20-4 may include a plurality of sub-pad portions, for example, first to third sub-pad portions 22, 24, and 26.

The first to third sub-pad portions 22, 24, and 26 included in the first pad 20-1 may be spaced apart from one another.

The first to third sub-pad portions 22, 24, and 26 may be electrically connected to one another by a buried conductive layer 140. A conductive via 150 may be located between each of the first to third sub-pad portions 22, 24, and 26 and the buried conductive layer 140. Each of the first to third sub-pad portions 22, 24, and 26 may be electrically connected to the buried conductive layer 140 by the conductive via 150.

Referring to FIG. 7C, a PCB 106 may include a substrate base 110 and a conductive pattern layer 120 formed on a surface of the substrate base 110. The substrate base 110 may be formed by stacking a first base layer 112 and a second base layer 114. The first sub-pad portion 12 or 22, the second sub-pad portion 14 or 24, and the third sub-pad portion 16 or 26 may be spaced apart from one another. The first sub-pad portion 12 or 22, the second sub-pad portion 14 or 24, and the third sub-pad portion 16 or 26 may be electrically connected to one another by the buried conductive layer 140 and the conductive via 150.

The buried conductive layer 140 may be formed in the substrate base 110. The buried conductive layer 140 may be formed between the first base layer 112 and the second base layer 114. The conductive via 150 may extend from a surface of the substrate base 110 into the substrate base 110. The conductive via 150 may penetrate the first base layer 112 and connect each of the first to third sub-pad portions 22, 24, and 26 with the buried conductive layer 140.

FIG. 7C illustrates a case in which the conductive via 150 penetrates both the conductive pattern layer 120 and the first base layer 112 into the buried conductive layer 140, but the inventive concepts are not limited thereto. The conductive via 150 may penetrate the first base layer 112 and extend from a bottom surface of the conductive pattern layer 120 only to a top surface of the buried conductive layer 140. In some embodiments, the conductive via 150 may extend from the bottom surface of the conductive pattern layer 120 into the conductive pattern layer 120 and/or extend from the top surface of the buried conductive layer 140 into the buried conductive layer 140. In some embodiments, the conductive via 150 may penetrate the conductive pattern layer 120 and/or the buried conductive layer 140.

Figure 8A:
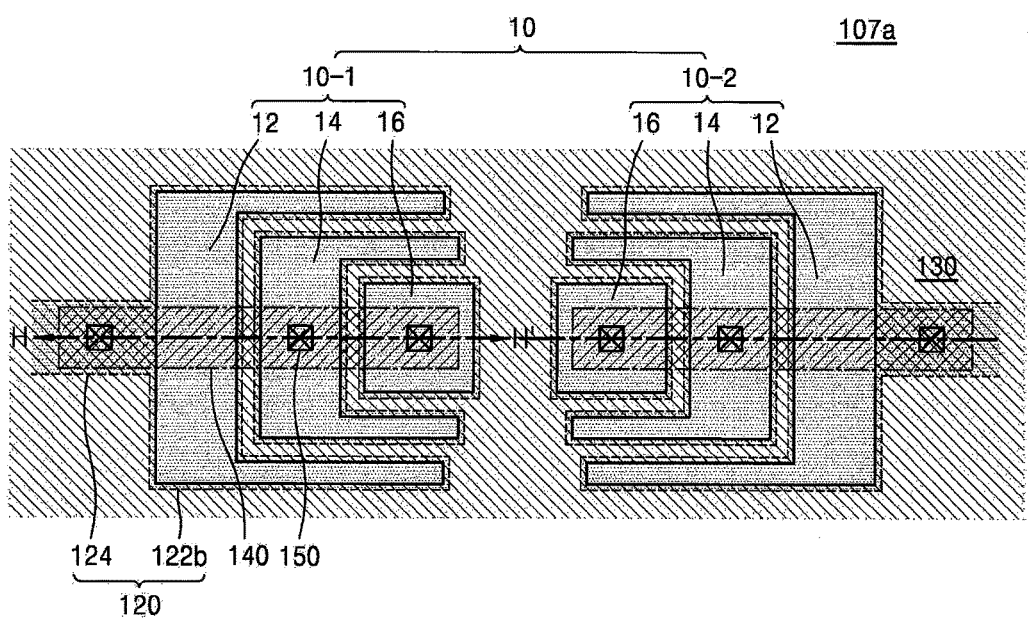
FIGS. 8A to 8C are schematic plan views and cross-sectional view of connection relationships between sub-pad portions included in pad groups formed on PCBs according to some embodiments.
Figure 8B:
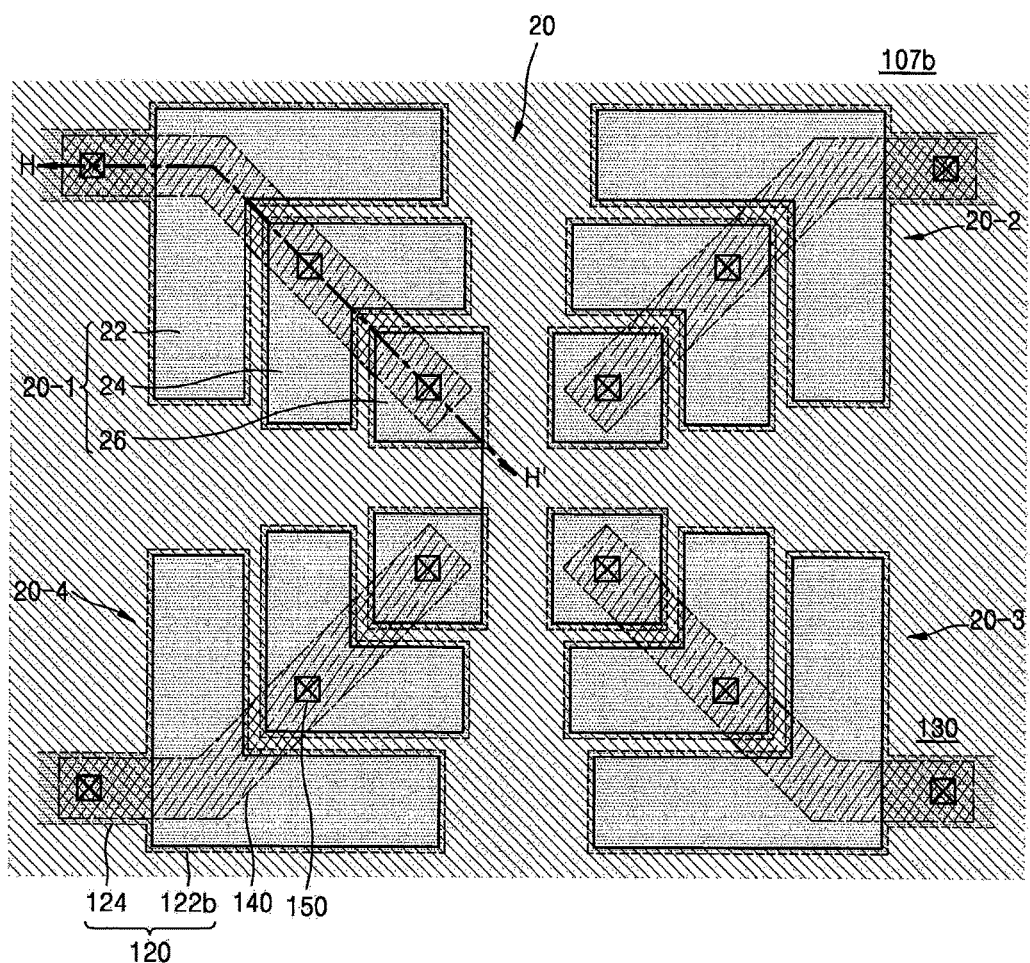
Figure 8C:
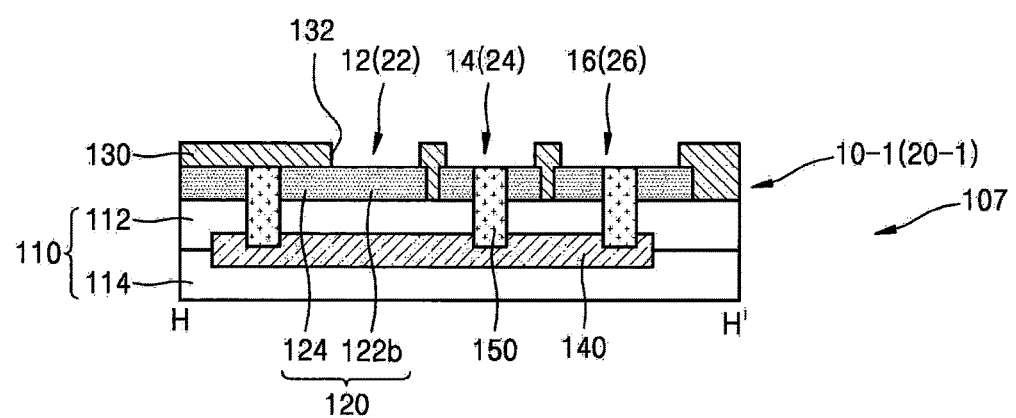

FIGS. 8A to 8C are schematic plan views and cross-sectional view of connection relationships between sub-pad portions included in pad groups formed on PCBs 107a according to some embodiments. Specifically, FIG. 8C is a schematic cross-sectional view taken along a line H-H' of FIG. 8A or FIG. 8B.

Referring to FIG. 8A, the PCB 107a may include a pad group 10 including a first pad 10-1 and a second pad 10-2. Each of the first and second pads 10-1 and 10-2 may include a plurality of sub-pad portions, for example, first to third sub-pad portions 12, 14, and 16.

The first to third sub-pad portions 12, 14, and 16 included in the first pad 10-1 or the second pad 10-2 may be spaced apart from one another. A conductive pattern layer 120 may include a conductive pattern 122a and an interconnection pattern 124. The conductive pattern 122a may include the first to third sub-pad portions 12, 14, and 16 that are spaced apart from one another. The first sub-pad portion 12 may be connected to an interconnection pattern 124. The first sub-pad portion 12 and the interconnection pattern 124 may be integrally formed and become a portion of the conductive pattern layer 120.

The first to third sub-pad portions 12, 14, and 16 may be electrically connected to one another by a buried conductive layer 140. Conductive vias 150 may be located between each of the second and third sub-pad portions 14 and 16 and the buried conductive layer 140 and between the interconnection pattern 124 connected to the first sub-pad portion 12 and the buried conductive layer 140. Accordingly, each of the first to third sub-pad portions 12, 14, and 16 may be electrically connected to the buried conductive layer 140 by the conductive via 150.

Referring to FIG. 8B, a PCB 107b may include a pad group 20 including first to fourth pads 20-1, 20-2, 20-3, and 20-4. Each of the first to fourth pads 20-1, 20-2, 20-3, and 20-4 may include a plurality of sub-pad portions, for example, first to third sub-pad portions 22, 24, and 26.

The first to third sub-pad portions 22, 24, and 26 included in the first pad 20-1 may be spaced apart from one another. A conductive pattern layer 120 may include a conductive pattern 122a and an interconnection pattern 124. The conductive pattern 122a may include first to third sub-pad portions 22, 24, and 26 that are spaced apart from one another. The first sub-pad portion 22 may be connected to the interconnection pattern 124. The first sub-pad portion 22 and the interconnection pattern 124 may be integrally formed and become a portion of the conductive pattern layer 120.

The first to third sub-pad portions 22, 24, and 26 may be electrically connected to one another by a buried conductive layer 140. Conductive vias 150 may be located between each of the second and third sub-pad portions 24 and 26 and the buried conductive layer 140 and between the interconnection pattern 124 connected to the first sub-pad portion 22 and the buried conductive layer 140. Accordingly, each of the first to third sub-pad portions 22, 24, and 26 may be electrically connected to the buried conductive layer 140 by the conductive via 150.

Referring to FIG. 8C, a PCB 107 may include a substrate base 110 and a conductive pattern layer 120 formed on a surface of the substrate base 110. The substrate base 110 may be prepared by stacking a first base layer 112 and a second base layer 114. The first sub-pad portion 12 or 22, the second sub-pad portion 14 or 24, and the third sub-pad portion 16 or 26 may be spaced apart from one another.

The first sub-pad portion 12 and an interconnection pattern 124 may be portions of the conductive pattern layer 120, which may be integrally formed and be at the same level as a main surface of the substrate base 110.

The first sub-pad portion 12 or 22, the second sub-pad portion 14 or 24, and the third sub-pad portion 16 or 26 may be electrically connected to one another by a buried conductive layer 140. The buried conductive layer 140 may be formed in the substrate base 110. The buried conductive layer 140 may be formed between a first base layer 112 and a second base layer 114. A conductive via 150 may extend from a surface of the substrate base 110 into the substrate base 110. The conductive via 150 may penetrate the first base layer 112 and be connected to the buried conductive layer 140.

Conductive vias 150 may be respectively located between each of the second sub-pad portion 14 or 24 and the third sub-pad portion 16 or 26 and the buried conductive layer 140 and between an interconnection pattern 124 connected to the first sub-pad portion 12 or 22 and the buried conductive layer 140. Accordingly, each of the first sub-pad portion 12 or 22, the second sub-pad portion 14 or 24, and the third sub-pad portion 16 or 26 may be electrically connected to the buried conductive layer 140 by the conductive via 150.

Figure 9A:
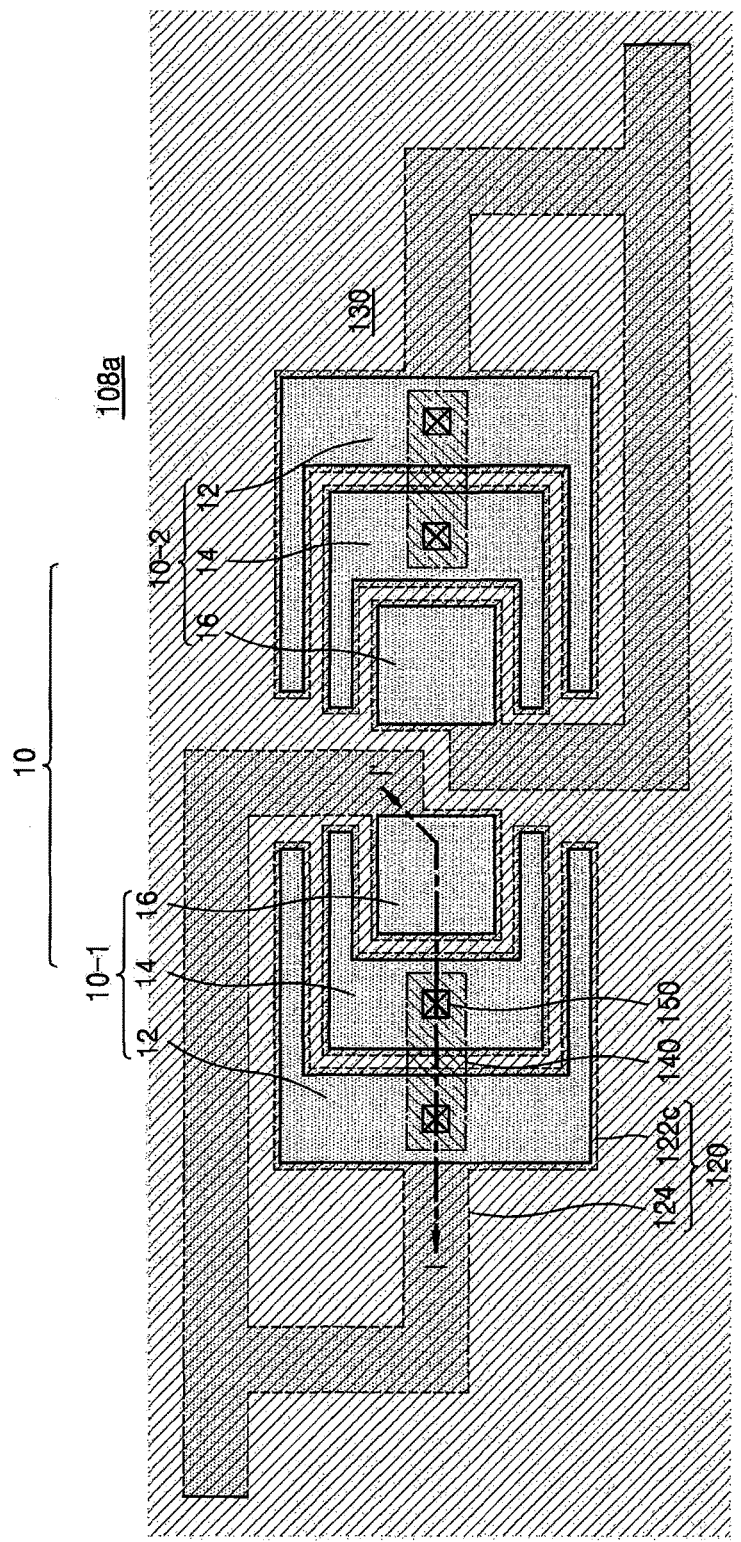
FIGS. 9A to 9C are schematic plan views and cross-sectional view of connection relationships between sub-pad portions included in pad groups formed on PCBs according to some embodiments.
Figure 9B:
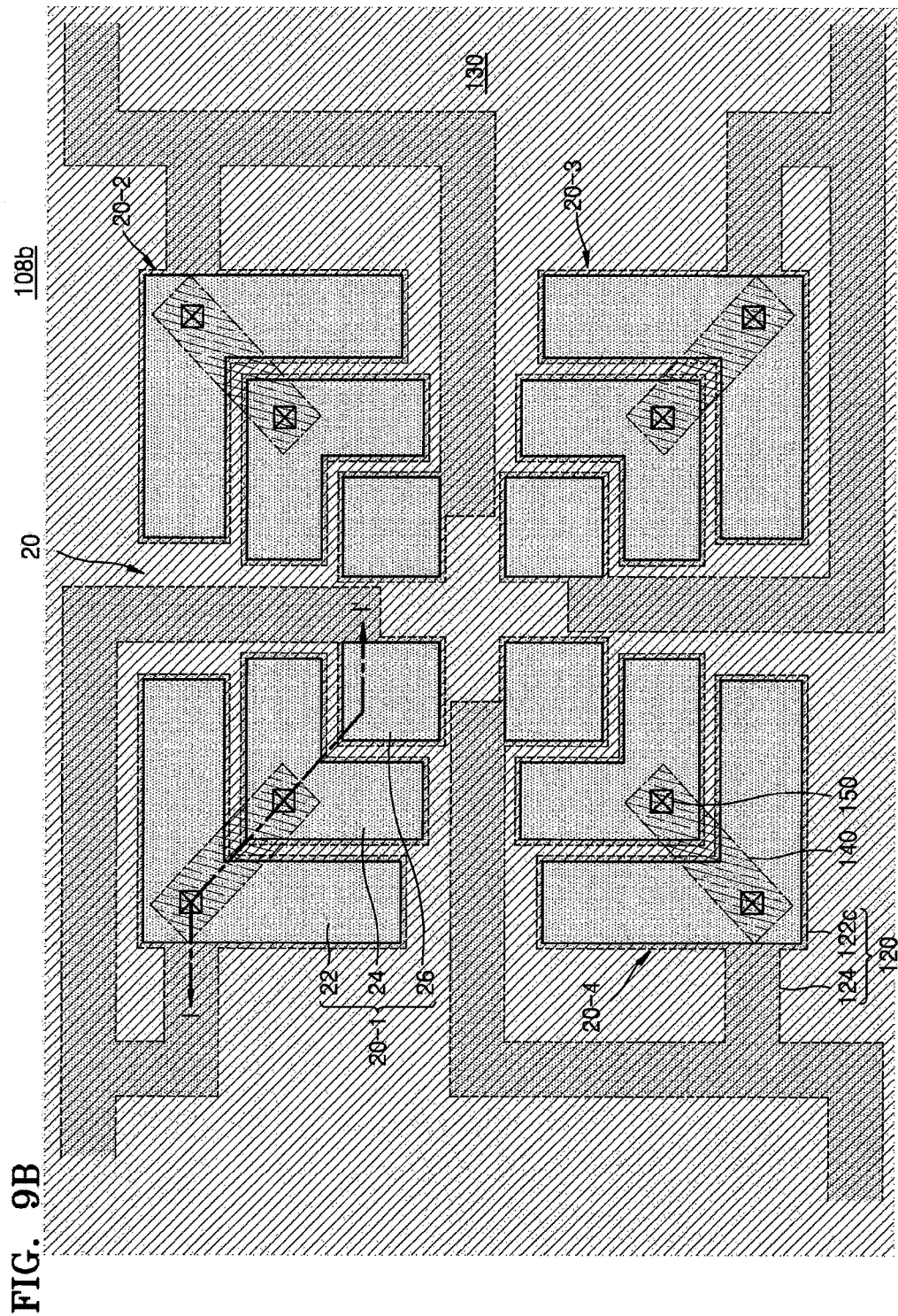
Figure 9C:
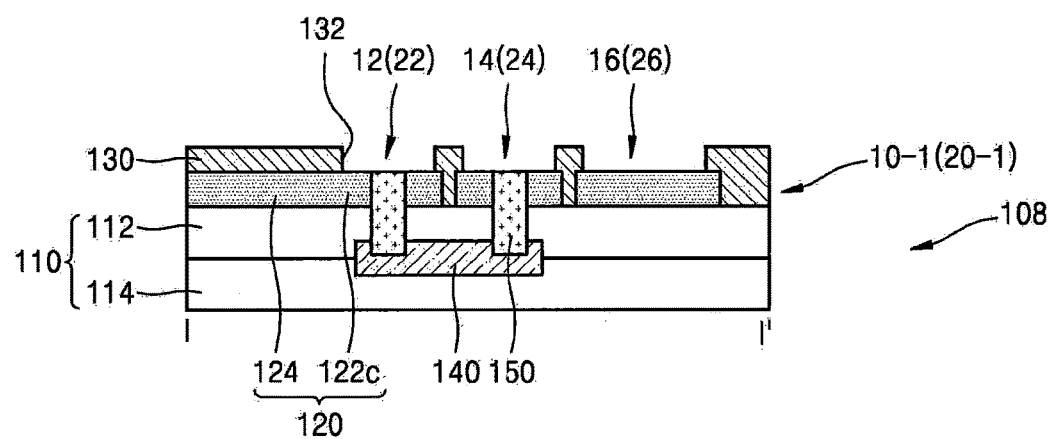

FIGS. 9A to 9C are schematic plan views and cross-sectional views of connection relationships between sub-pad portions included in pad groups formed on PCBs according to some embodiments. FIG. 9C is a schematic cross-sectional view taken along a line I-I' of FIG. 9A or FIG. 9B.

Referring to FIG. 9A, a PCB 108a may include a pad group 10 including a first pad 10-1 and a second pad 10-2. Each of the first and second pads 10-1 and 10-2 may include a plurality of sub-pad portions, for example, first to third sub-pad portions 12, 14, and 16.

In the first pad 10-1 or the second pad 10-2, the second sub-pad portion 14 may be spaced apart from the first and third sub-pad portions 12 and 16. A conductive pattern layer 120 may include a conductive pattern 122c and an interconnection pattern 124. The conductive pattern 122c may include the first to third sub-pad portions 12, 14, and 16. The first sub-pad portion 12 and the third sub-pad portion 16 may be connected to the interconnection pattern 124. The first sub-pad portion 12, the third sub-pad portion 16, and the interconnection pattern 124 may be portions of the conductive pattern layer 120 which is integrally formed. Accordingly, the first sub-pad portion 12 may be electrically connected to the third sub-pad portion 16 by the interconnection pattern 124. The interconnection pattern 124 may extend along circumference of the first pad 10-1 or the second pad 10-2 including the first to third sub-pad portions 12, 14, and 16 and connect the first sub-pad portion 12 with the third sub-pad portion 16.

The first sub-pad portion 12 may be electrically connected to the second sub-pad portion 14 by a buried conductive layer 140. A conductive via 150 may be located between each of the first and second sub-pad portions 12 and 14 and the buried conductive layer 140. Thus, each of the first and second sub-pad portions 12 and 14 may be electrically connected to the buried conductive layer 140 by the conductive via 150.

Accordingly, the first to third sub-pad portions 12, 14, and 16 may be electrically connected to one another by the interconnection pattern 124, the buried conductive layer 140, and the conductive vias 150.

Referring to FIG. 9B, a PCB 108b may include a pad group 20 including first to fourth pads 20-1, 20-2, 20-3, and 20-4. Each of the first to fourth pads 20-1, 20-2, 20-3, and 20-4 may include a plurality of sub-pad portions, for example, first to third sub-pad portions 22, 24, and 26.

In the first pad 20-1, the second sub-pad portion 24 may be spaced apart from the first and third sub-pad portions 22 and 26. A conductive pattern layer 120 may include a conductive pattern 122c and an interconnection pattern 124. The conductive pattern 122c may include first to third sub-pad portions 22, 24, and 26. The first sub-pad portion 22 and the third sub-pad portion 26 may be connected to the interconnection pattern 124. The first sub-pad portion 22, the third sub-pad portion 26, and the interconnection pattern 124 may be portions of the conductive pattern layer 120 which integrally form. Accordingly, the first sub-pad portion 22 may be electrically connected to the third sub-pad portion 26 by the interconnection pattern 124. The interconnection pattern 124 may extend along circumference of the first pad 20-1 including the first to third sub-pad portions 22, 24, and 26 and connect the first sub-pad portion 22 with the third sub-pad portion 26.

The first sub-pad portion 22 may be electrically connected to the second sub-pad portion 24 by a buried conductive layer 140. A conductive via 150 may be located between each of the first and second sub-pad portions 22 and 24 and the buried conductive layer 140. Thus, each of the first and second sub-pad portions 22 and 24 may be electrically connected to the buried conductive layer 140 by the conductive via 150.

Accordingly, the first to third sub-pad portions 22, 24, and 26 may be electrically connected to one another by the interconnection pattern 124, the buried conductive layer 140, and the conductive via 150.

Referring to FIG. 9C, a PCB 108 may include a substrate base 110 and a conductive pattern layer 120 formed on a surface of the substrate base 110. The substrate base 110 may be formed by stacking a first base layer 112 and a second base layer 114.

The conductive pattern layer 120 may include a conductive pattern 122c and an interconnection pattern 124. Referring to FIG. 9A or FIG. 9B and FIG. 9C, the first sub-pad portion 12 or 22 and the third sub-pad portion 16 or 26 may be connected to an interconnection pattern 124. The first sub-pad portion 12 or 22, the third sub-pad portion 16 or 26, and the interconnection pattern 124 may be portions of the conductive pattern layer 120, which may be integrally formed and be at the same level as a main surface of the substrate base 110.

The first sub-pad portion 12 or 22 may be electrically connected to the second sub-pad portion 14 or 24 by a buried conductive layer 140. The buried conductive layer 140 may be formed in the substrate base 110. The buried conductive layer 140 may be formed between the first base layer 112 and the second base layer 114. A conductive via 150 may extend from a surface of the substrate base 110 into the substrate base 110. The conductive via 150 may penetrate the first base layer 112 and be connected to the buried conductive layer 140.

The conductive via 150 may be located between each of the first sub-pad portion 12 or 22 and the second sub-pad portion 14 or 24 and the buried conductive layer 140. Thus, each of the first sub-pad portion 12 or 22 and the second sub-pad portion 14 or 24 may be electrically connected to the buried conductive layer 140 by the conductive via 150.

Figure 10A:
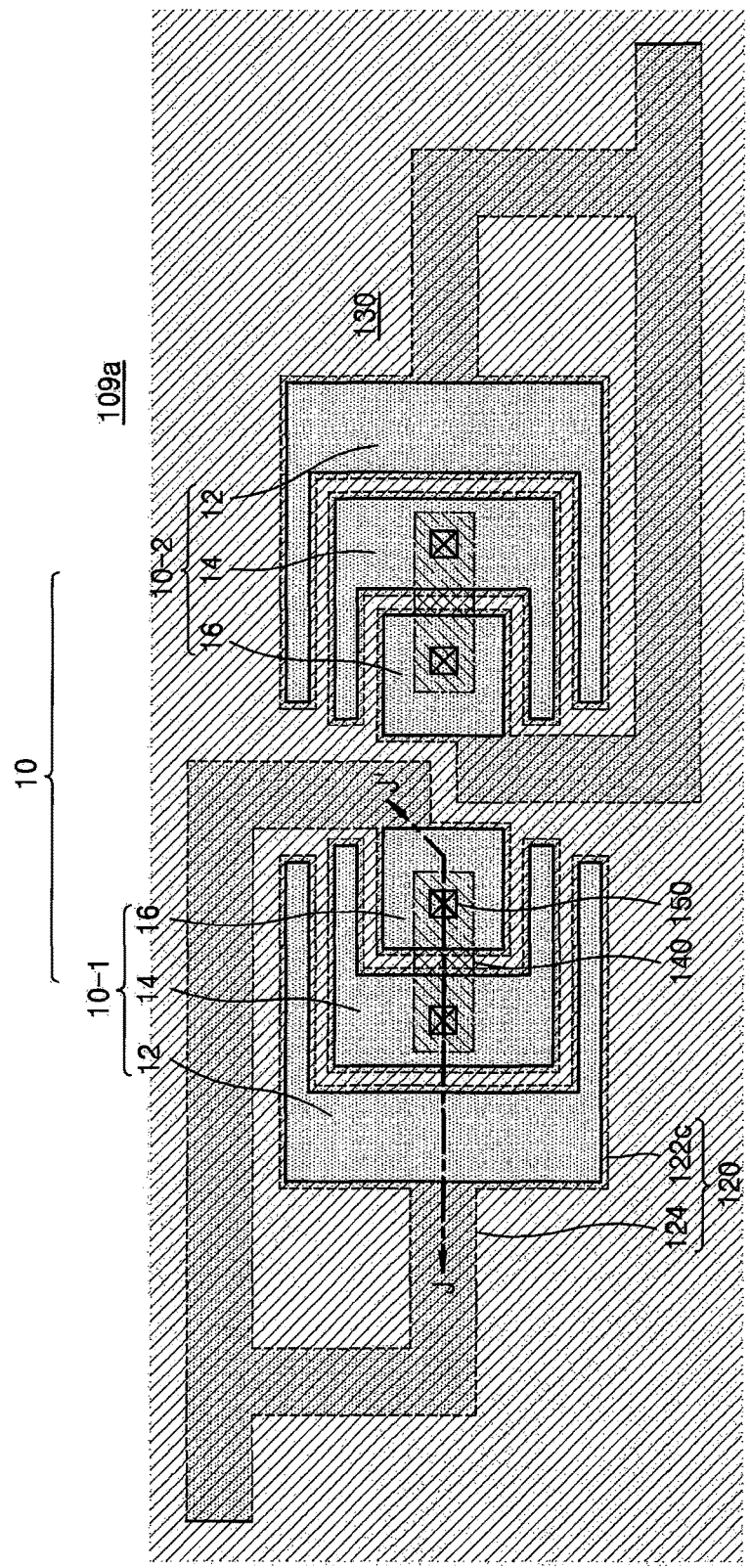
FIGS. 10A to 10C are schematic plan views and cross-sectional view of connection relationships between sub-pad portions included in pad groups formed on PCBs according to some embodiments.
Figure 10B:
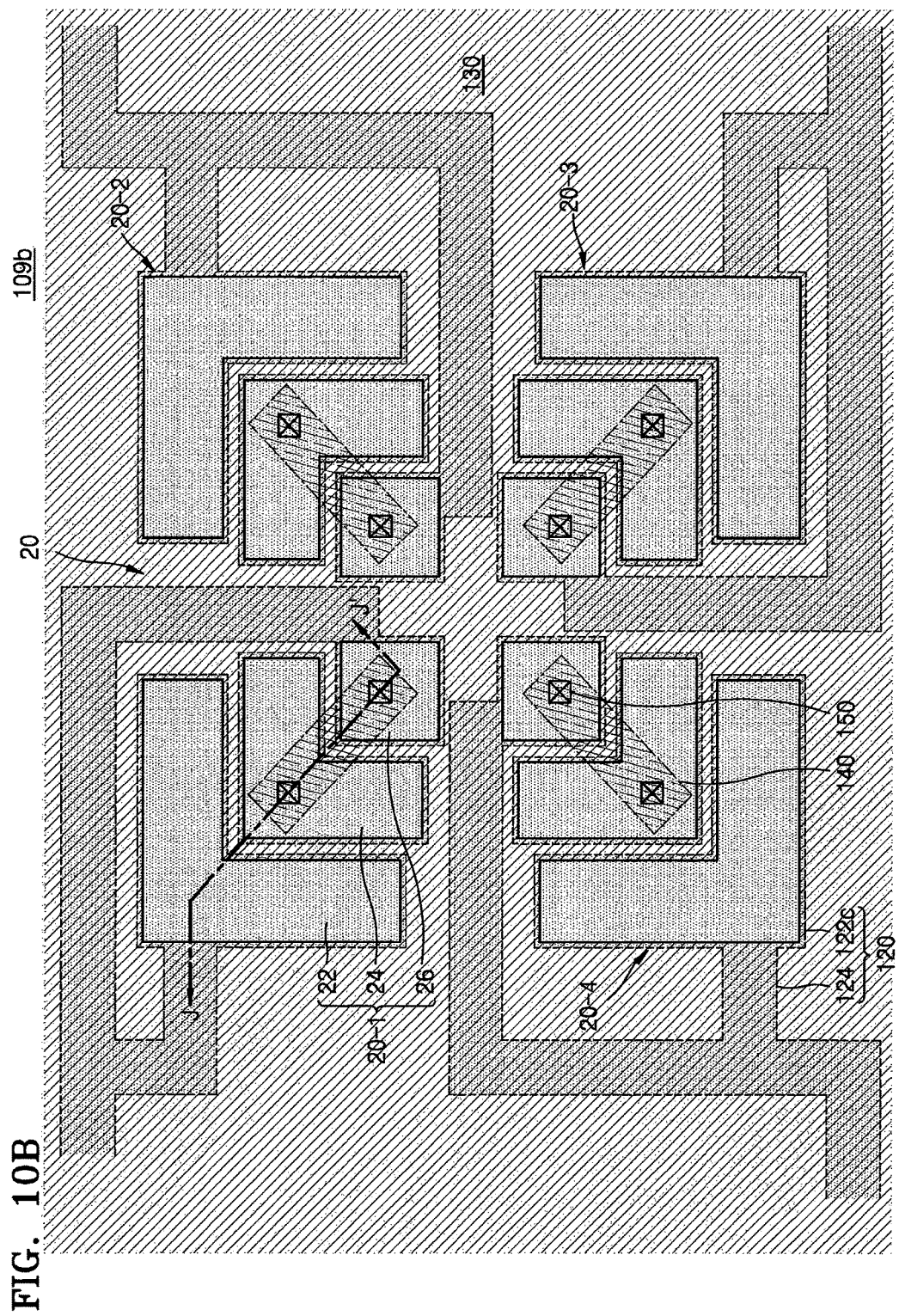
Figure 10C:
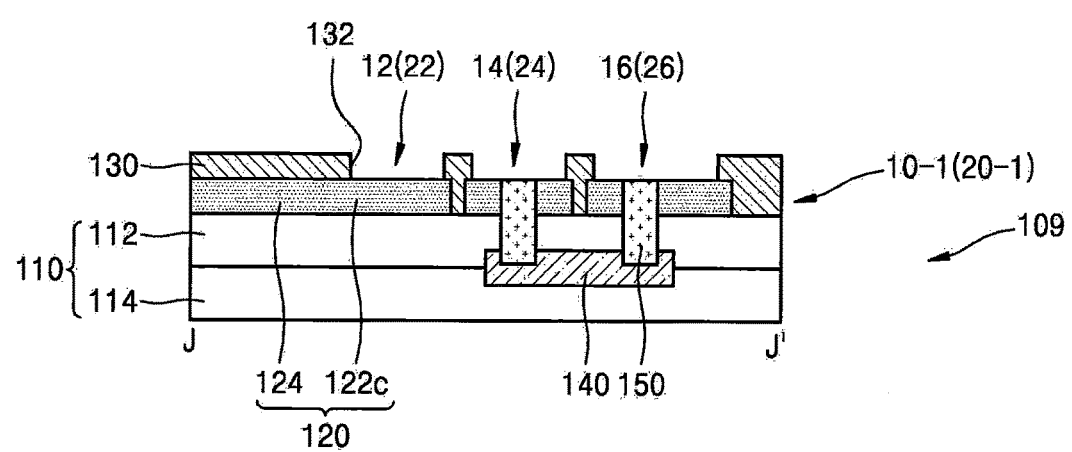

FIGS. 10A to 10C are schematic plan views and cross-sectional view of connection relationships between sub-pad portions included in pad groups formed on PCBs according to some embodiments. Specifically, FIG. 10C is a schematic cross-sectional view taken along a line J-J' of FIG. 10A or FIG. 10B. In FIGS. 10A to 10C, the same descriptions as in FIGS. 9A to 9C may be omitted.

Referring to FIG. 10A, the PCB 109a may include a pad group 10 including a first pad 10-1 and a second pad 10-2. Each of the first and second pads 10-1 and 10-2 may include a plurality of sub-pad portions, for example, first to third sub-pad portions 12, 14, and 16.

In the first pad 10-1 or the second pad 10-2, the second sub-pad portion 14 may be spaced apart from the first and third sub-pad portions 12 and 16. The first sub-pad portion 12 and the third sub-pad portion 16 may be connected to an interconnection pattern 124.

The second sub-pad portion 14 may be electrically connected to the third sub-pad portion 16 by a buried conductive layer 140. A conductive via 150 may be located between each of the second and third sub-pad portions 14 and 16 and the buried conductive layer 140. Thus, each of the second and third sub-pad portions 14 and 16 may be electrically connected to the buried conductive layer 140 by the conductive via 150.

Accordingly, the first to third sub-pad portions 12, 14, and 16 may be electrically connected to one another by the interconnection pattern 124, the buried conductive layer 140, and the conductive via 150.

Referring to FIG. 10B, a PCB 109b may include a pad group 20 including first to fourth pads 20-1, 20-2, 20-3, and 20-4. Each of the first to fourth pads 20-1, 20-2, 20-3, and 20-4 may include a plurality of sub-pad portions, for example, first to third sub-pad portions 22, 24, and 26.

In the first pad 20-1, the second sub-pad portion 24 may be spaced apart from the first and third sub-pad portions 22 and 26. The first sub-pad portion 22 and the third sub-pad portion 26 may be connected to an interconnection pattern 124.

The second sub-pad portion 24 may be electrically connected to the third sub-pad portion 26 by a buried conductive layer 140. A conductive via 150 may be located between each of the second and third sub-pad portions 24 and 26 and the buried conductive layer 140. Thus, each of the second and third sub-pad portions 24 and 26 may be electrically connected to the buried conductive layer 140 by the conductive via 150.

Accordingly, the first to third sub-pad portions 22, 24, and 26 may be electrically connected to one another by the interconnection pattern 124, the buried conductive layer 140, and the conductive via 150.

Referring to FIG. 10C, a PCB 109 may include a substrate base 110 and a conductive pattern layer 120 formed on a surface of the substrate base 110. The substrate base 110 may be formed by stacking a first base layer 112 and a second base layer 114.

The conductive pattern layer 120 may include a conductive pattern 122c and an interconnection pattern 124. The first sub-pad portion 12 or 22, the third sub-pad portion 16 or 26, and the interconnection pattern 124 may be portions of the conductive pattern layer 120, which are integrally formed and be at the same level as a main surface of the substrate base 110.

The second sub-pad portion 14 or 24 and the third sub-pad portion 16 or 26 may be electrically connected to each other by a buried conductive layer 140. The buried conductive layer 140 may be formed in the substrate base 110. The buried conductive layer 140 may be formed between the first base layer 112 and the second base layer 114. The conductive via 150 may extend from a surface of the substrate base 110 into the substrate base 110. The conductive via 150 may penetrate the first base layer 112 and be connected to the buried conductive layer 140.

A conductive via 150 may be located between each of the second sub-pad portion 14 or 24 and the third sub-pad portion 16 or 26 and the buried conductive layer 140. Accordingly, each of the second sub-pad portion 14 or 24 and the third sub-pad portion 16 or 26 may be electrically connected to the buried conductive layer 140 by the conductive via 150.

FIGS. 11A to 11E are schematic plan views of pad groups formed on PCBs according to some embodiments. In FIGS. 11A to 11E, the same descriptions as in FIGS. 1A to 10C may be omitted.

Figure 11A:
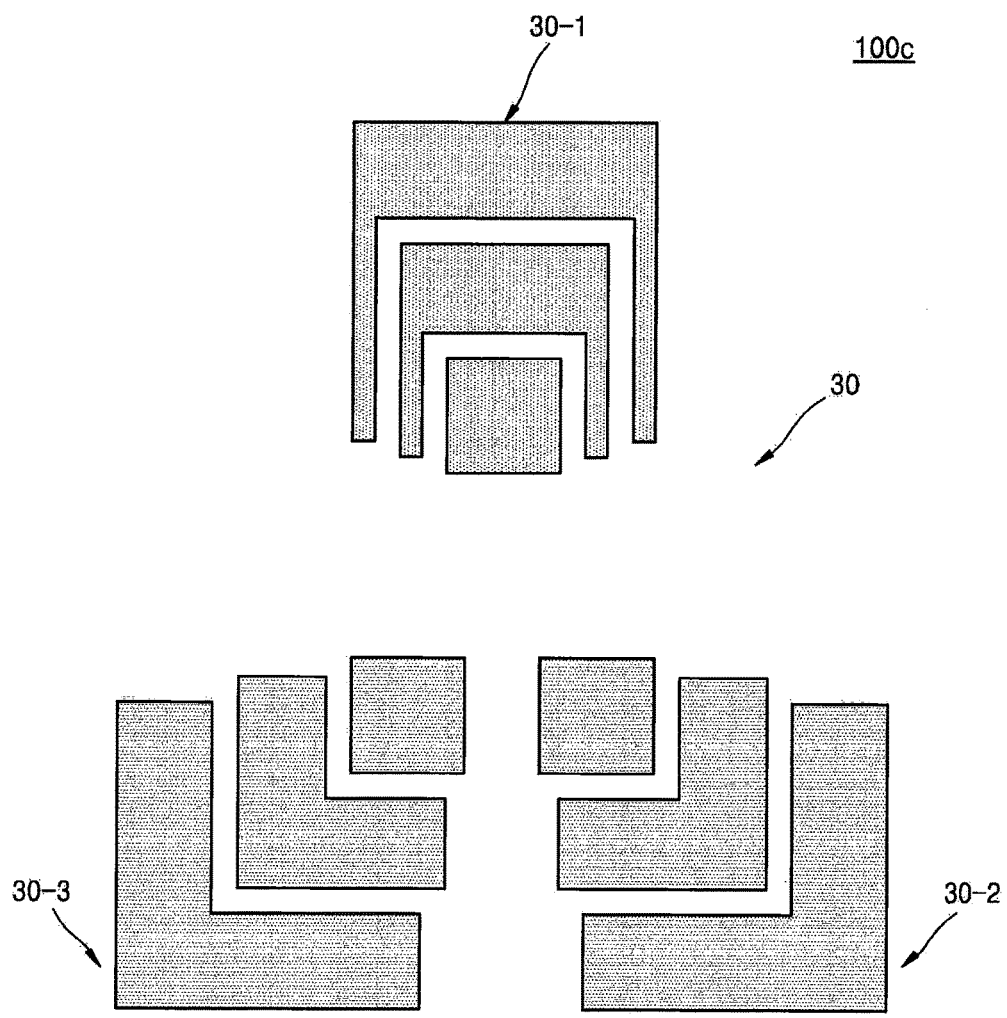
FIGS. 11A to 11E are schematic plan views of pad groups formed on PCBs according to some embodiments.

Referring to FIG. 11A, a PCB 100c may include a pad group 30 including a plurality of pads, for example, first to third pads 30-1, 30-2, and 30-3. For example, when an electronic component to be mounted on the PCB 100c has three connection terminals, the pad group 30 may include a first pad 30-1, a second pad 30-2, and a third pad 30-3 corresponding to the electronic component having the three connection terminals.

The first pad 30-1 may have the same shape as the first and second pads 10-1 and 10-2 shown in FIG. 1A, and the second and third pads 30-2 and 30-3 may have the same shape as the first to fourth pads 20-1, 20-2, 20-3, and 20-4 shown in FIG. 1B, and thus detailed descriptions thereof are omitted.

When the pad group 30 includes three pads 30-1, 30-2, and 30-3, one pad (i.e., the first pad 30-1) may have at least one U-shaped sub-pad portion that partially surrounds a sub-pad portion having a tetragonal shape, and a pair of pads (i.e., the second and third pads 30-2 and 30-3) may have at least one L-shaped sub-pad portion that partially surrounds a sub-pad portion having a tetragonal shape.

Figure 11B:
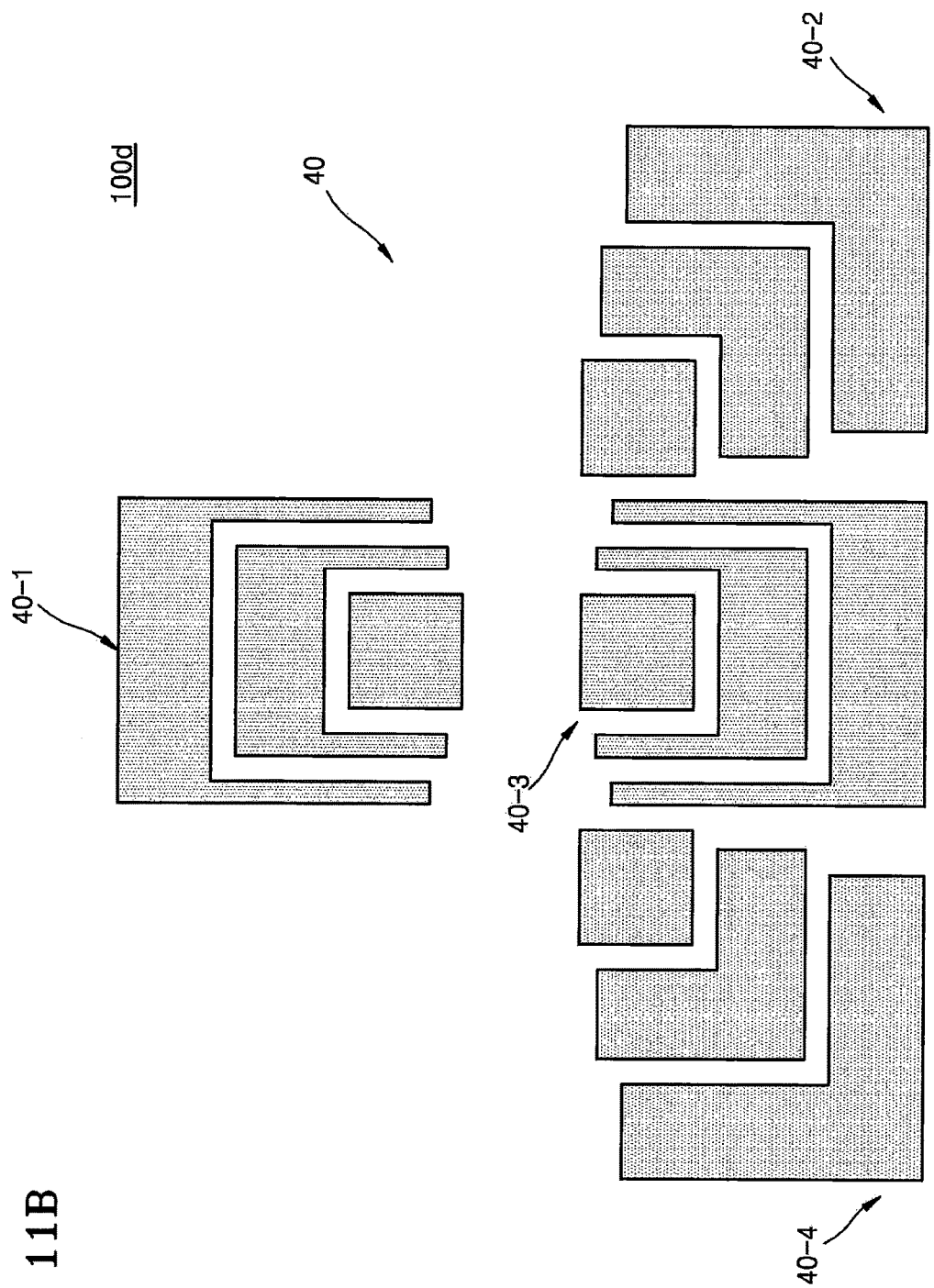

Referring to FIG. 11B, a PCB 100d may include a pad group 40 including a plurality of pads, for example, first to fourth pads 40-1, 40-2, 40-3, and 40-4. For example, when an electronic component to be mounted on the PCB 100d has four connection terminals, the pad group 40 may include the first pad 40-1, the second pad 40-2, the third pad 40-3, and the fourth pad 40-4 corresponding to the electronic component having the four connection terminals.

The first and third pads 40-1 and 40-2 may have the same shape as the first and second pads 10-1 and 10-2 shown in FIG. 1A, and the second and fourth pads 40-2 and 40-4 may have the same shape as the first to fourth pads 20-1, 20-2, 20-3, and 20-4 shown in FIG. 1B, and thus detailed descriptions thereof are omitted.

When three pads of the four pads 40-1, 40-2, 40-3, and 40-4 included in the pad group 40 are located in one side and one pad thereof is located in the other side, each of a pair of pads (e.g., the first and third pads 40-1 and 40-3) may include at least one U-shaped sub-pad portion that partially surrounds a sub-pad portion having a tetragonal shape, and each of another pair of pads (e.g., the second and fourth pads 40-2 and 40-4) may include at least one L-shaped sub-pad portion that partially surrounds a sub-pad portion having a tetragonal shape.

Figure 11C:
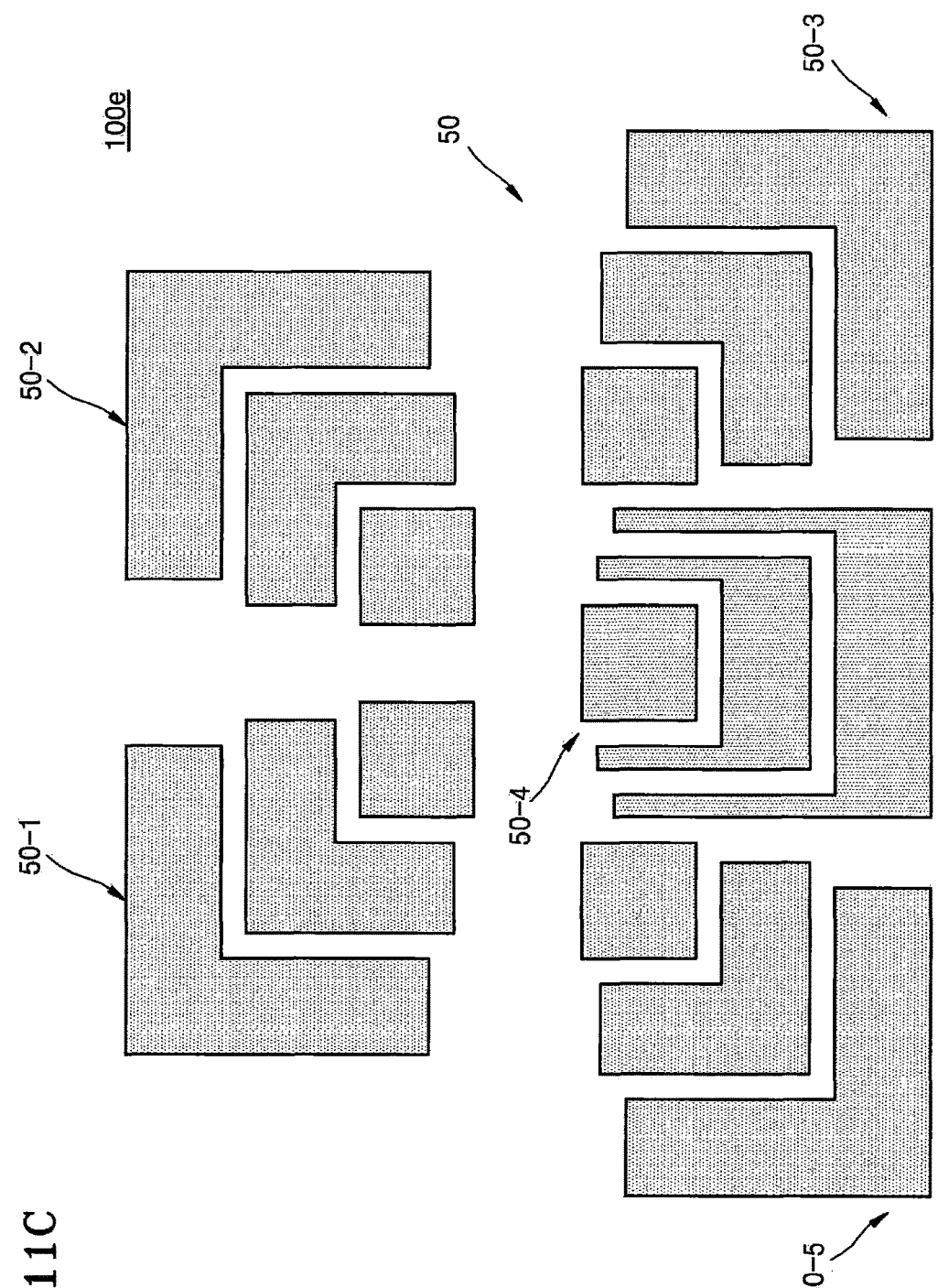

Referring to FIG. 11C, a PCB 100e may include a pad group 50 including a plurality of pads, for example, first to fifth pads 50-1, 50-2, 50-3, 50-4, and 50-5. For example, when an electronic component to be mounted on the PCB 100e has five connection terminals, the pad group 50 may include the first pad 50-1, the second pad 50-2, the third pad 50-3, the fourth pad 50-4, and the fifth pad 50-5 corresponding to the electronic component having the five connection terminals.

The fourth pad 50-4 may have the same shape as the first and second pads 10-1 and 10-2 shown in FIG. 1A, and the first, second, third, and fifth pads 50-1, 50-2, 50-3, and 50-5 may have the same shape as the first to fourth pad 20-1, 20-2, 20-3, and 20-4 shown in FIG. 1B, and thus detailed descriptions thereof are omitted.

When three pads of the five pads 50-1, 50-2, 50-3, 50-4, and 50-5 included in the pad group 50 are located in one side of the pad group 50 and two pads thereof are located in the other side thereof, one pad (i.e., the fourth pad 50-5) may have at least one U-shaped sub-pad portion that partially surrounds a sub-pad portion having a tetragonal shape, and each of the four other pads (i.e., the first, second, third, and fifth pads 50-1, 50-2, 50-3, and 50-5) may have at least one L-shaped sub-pad portion that partially surrounds a sub-pad portion having a tetragonal shape.

Figure 11D:
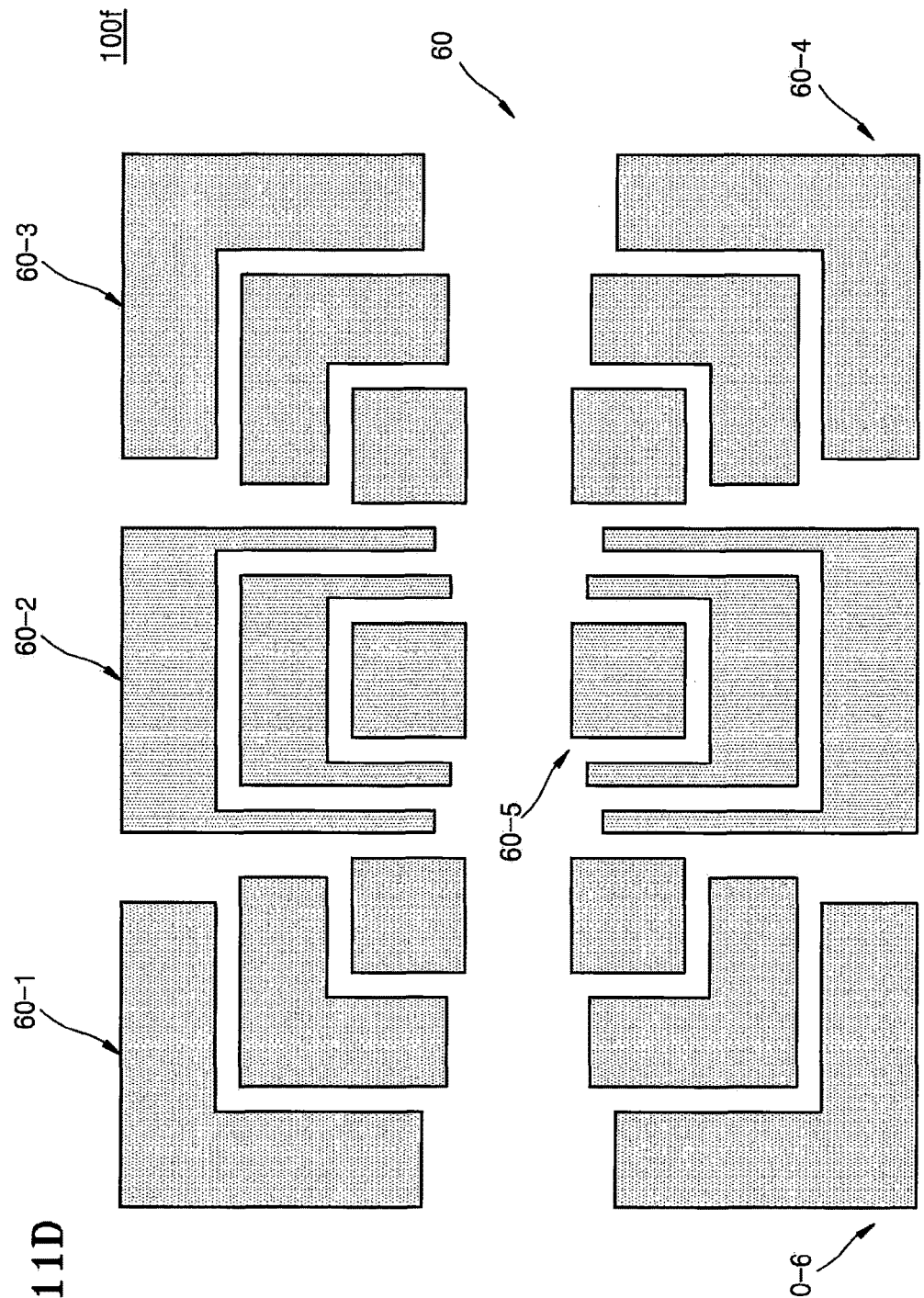

Referring to FIG. 11D, a PCB 100f may include a pad group 60 including a plurality of pads, for example, first to sixth pads 60-1, 60-2, 60-3, 60-4, 60-5, and 60-6. For example, when an electronic component to be mounted on the PCB 100f has six connection terminals, the pad group 60 may include the first pad 60-1, the second pad 60-2, the third pad 60-3, the fourth pad 60-4, the fifth pad 60-5, and the sixth pad 60-6 corresponding to the electronic component having the six connection terminals.

The second and fifth pads 60-2 and 60-5 may have the same shape as the first and second pads 10-1 and 10-2 shown in FIG. 1A, and the first, third, fourth, and sixth pads 60-1, 60-3, 60-4, and 60-6 may have the same shape as the first to fourth pad 20-1, 20-2, 20-3, and 20-4 shown in FIG. 1B, and thus detailed descriptions thereof are omitted.

When three pads of the six pads 60-1, 60-2, 60-3, 60-4, 60-5, and 60-6 included in the pad group 40 are located on one side of the pad group 40 and the other three pads thereof are located on the other side thereof, each of middle pads (i.e., the second and fifth pads 60-2 and 60-5) located on both sides may have at least one U-shaped sub-pad portion that partially surrounds a sub-pad portion having a tetragonal shape, and each of pads (i.e., the first, third, fourth, and sixth pads 60-1, 60-3, 60-4, and 60-6) located on both sides of the middle pads may have at least one L-shaped sub-pad portion that partially surrounds a sub-pad portion having a tetragonal shape.

Figure 11E:
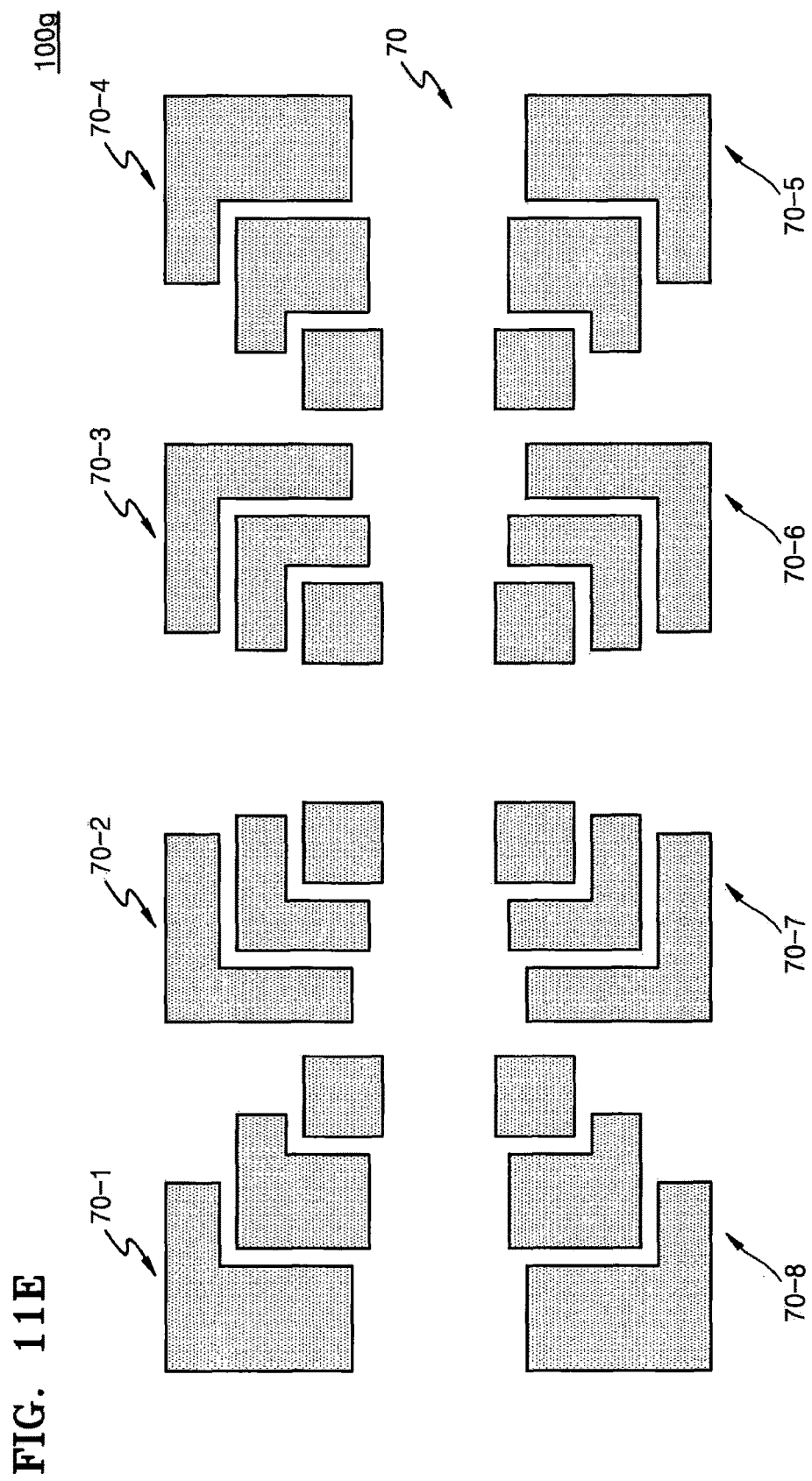

Referring to FIG. 11E, a PCB 100g may include a pad group 70 including a plurality of pads, for example, first to eighth pads 70-1, 70-2, 70-3, 70-4, 70-5, 70-6, 70-7, and 70-8. For example, when an electronic component to be mounted on the PCB 100g has eight connection terminals, the pad group 70 may include the first pad 70-1, the second pad 70-2, the third pad 70-3, the fourth pad 70-4, the fifth pad 70-5, the sixth pad 70-6, the seventh pad 70-7, and the eighth pad 70-8 corresponding to the electronic component having the eight connection terminals.

Since the first to eighth pads 70-1, 70-2, 70-3, 70-4, 70-5, 70-6, 70-7, and 70-8 have the same shape as the first to fourth pads 20-1, 20-2, 20-3, and 20-4 shown in FIG. 1B, and thus detailed descriptions thereof are omitted.

Referring to FIGS. 1B and 11E, the number of pads in a pad group may be a multiple of 4 so that the number of pads may be the same on each side. For example, in FIG. 1B, pad group 20 includes four pads 20-1, 20-2, 20-3, and 20-4, and in FIG. 11e, pad group 70 includes eight pads 70-1, 70-2, 70-3, 70-4, 70-5, 70-6, 70-7, and 70-8. Each of the pads in a pad group may have at least one L-shaped sub-pad portion that partially surrounds a sub-pad portion having a tetragonal shape.

In addition, when at least four pads are located on each of the two sides, as shown in FIG. 11e, a distance by which a protruding sub-pad portion protrudes may be larger in each of outer pads 70-1, 70-4, 70-5, and 70-8 than in each of inner pads 70-2, 70-2, 70-6, and 70-7.

Figure 12:
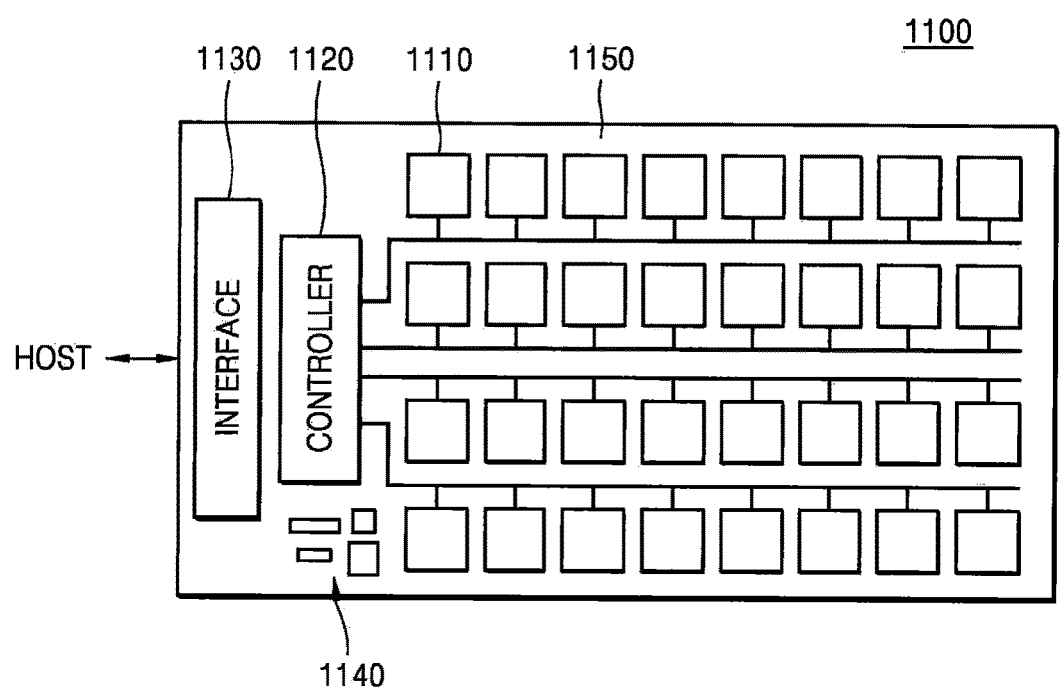
FIG. 12 is a construction diagram of an electronic device according to some embodiments.

FIG. 12 is a construction diagram of an electronic device according to some embodiments. FIG. 12 illustrates a solid-state drive (SSD) device 1100 as an example of an electronic device including a PCB.

Referring to FIG. 12, the SSD device 1100 may include a plurality of non-volatile memories 1110, a controller 1120, and an electronic component 1140, which are mounted on a PCB 1150. The PCB 1150 may be any one of the PCBs 100, 100a, 100b, 100c, 100d, 100e, 100f, 100g, 102, 102a, 102b, 104, 104a, 104b, 106, 106a, 106b, 107, 107a, 107b, 108, 108a, 108b, 109, 109a, and 109b described with reference to FIG. 1A to 11E or a combination thereof. The non-volatile memory 1110 may store data and have non-volatile characteristics so that stored data may be retained even if power supply is interrupted.

The controller 1120 may read data stored in the non-volatile memory 1110 or store data in the non-volatile memory 1110 in response to read/write requests from a host HOST. The interface 1130 may transmit a command and an address signal to the host HOST or receive the command and the address signal from the host HOST. Also, the interface 1130 may transmit the command and the address signal to the non-volatile memory 1110 again via the controller 1120 or receive the command and the address signal from the non-volatile memory 1110.

The electronic component 1140 may be at least one of the electronic components 500, 502, and 504 described with reference to FIGS. 2D, 3D, and 4D. The electronic component 1140 may be an active device or a passive device, such as a resistor, a capacitor, an inductor, a switch, a temperature sensor, a DC-DC converter, or a quartz or voltage regulator configured to generate a clock. Alternatively, the electronic component 1140 may be a semiconductor device, such as a diode or a transistor. Alternatively, the electronic component 1140 may be an IC having a relatively small number of connection terminals.

The electronic component 1140 may be electrically connected to the PCB 1150 by at least one of the pad groups 10, 20, 30, 40, 50, 60, and 70 described with reference to FIGS. 1A to 11E.

Figure 13:
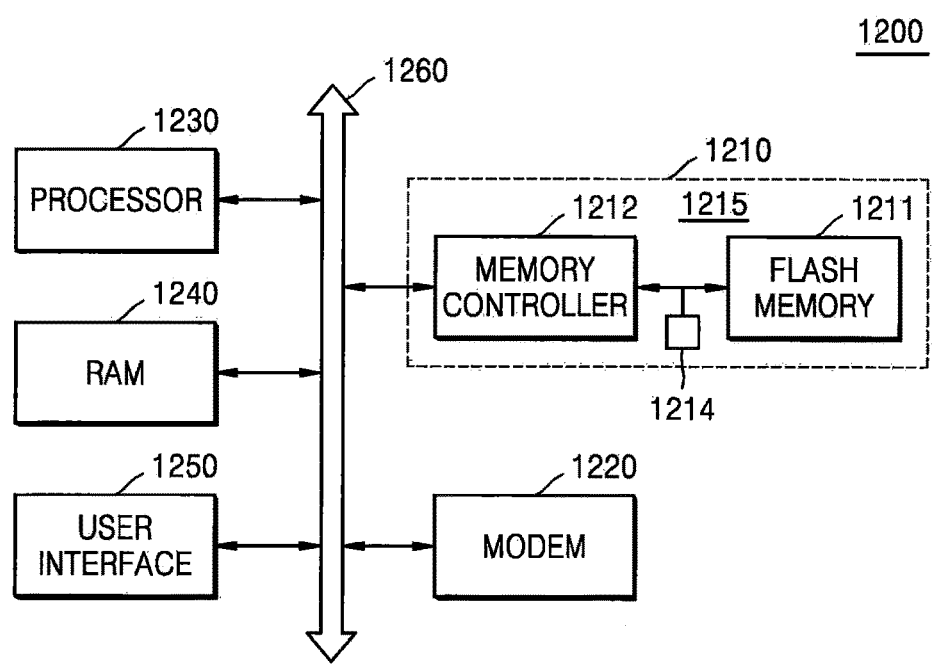
FIG. 13 is a block diagram of a system according to some embodiments.

FIG. 13 is a block diagram of a system 1200 according to some embodiments. FIG. 13 illustrates a solid-state drive (SSD) as an example of an electronic device included in the system.

Referring to FIG. 13, the system 1200 may include a processor 1230 (e.g., a central processing unit (CPU)), a random access memory (RAM) 1240), a user interface 1250, and a modem 1220, which may communicate with one another via a common bus 1260. The respective elements may transmit signals to a storage device (e.g., an SSD 1210) or receive signals from the SSD 1210 via the common bus 1260. The SSD 1210 may include a flash memory 1211, a memory controller 1212, and an electronic component 1214, which may be mounted on a PCB 1215.

The PCB 1215 may be any one of the PCBs 100, 100a, 100b, 100c, 100d, 100e, 100f, 100g, 102, 102a, 102b, 104, 104a, 104b, 106, 106a, 106b, 107, 107a, 107b, 108, 108a, 108b, 109, 109a, and 109b described with reference to FIG. 1A to 11E or a combination thereof. The flash memory 1210 may store data and have non-volatile characteristics so that stored data may be retained even if power supply is interrupted.

The memory controller 1212 may read data stored in the flash memory 1210 or store data in the flash memory 1210 in response to read/write requests from the common bus 1260.

The electronic component 1214 may be at least one of the electronic components 500, 502, and 504 described with reference to FIGS. 2D, 3D, and 4D. The electronic component 1214 may be electrically connected to the PCB 1215 by at least one of the pad groups 10, 20, 30, 40, 50, 60, and 70 described with reference to FIGS. 1A to 11E.

While the inventive concept has been particularly shown and described with reference to some embodiments thereof, it will be understood that various changes in form and details may be made therein without departing from the spirit and scope of the following claims.

What is claimed is:

1. A printed circuit board (PCB) comprising:
a substrate having a surface; and
a pad group on the surface of the substrate, the pad group including at least two pads, each of the at least two pads including a first sub-pad portion and a second sub-pad portion, different and separate from the first sub-pad portion,
wherein the first sub-pad portion partially surrounds at least three sides of the second sub-pad portion; and
wherein the second sub-pad portion of one of the at least two pads protrudes from an end portion of the first sub-pad portion toward another pad of the at least two pads.

2. The PCB of claim 1, wherein the first and second sub-pad portions included in one of the at least two pads are portions of a conductive pattern, are integrally formed, and are at a same level as the surface of the substrate, and
wherein the PCB further comprises a solder resist layer having openings exposing the first and second sub-pad portions in the at least two pads, the solder resist layer covering a portion of the conductive pattern and surrounding the first and second sub-pad portions included in the one pad.

3. The PCB of claim 1, further comprising:
a connection bridge in a portion of a space between the first and second sub-pad portions included in one of the at least two pads;
wherein the first and second sub-pad portions included in the one of the at least two pads are connected to each other by the connection bridge; and wherein the first sub-pad portion, the second sub-pad portion, and the connection bridge are integrally formed and are at a same level as the surface of the substrate.

4. The PCB of claim 1, wherein the first and second sub-pad portions included in one of the at least two pads are spaced apart from each other and electrically connected to each other by a buried conductive layer included in the substrate.

5. The PCB of claim 4, further comprising a conductive via extending from each of the first and second sub-pad portions into the substrate and connecting each of the first and second sub-pad portions to the buried conductive layer.

6. The PCB of claim 1, wherein each of the at least two pads further comprises a third sub-pad portion located between the first sub-pad portion and the second sub-pad portion, and
wherein the third sub-pad portion of one of the at least two pads protrudes from the end portion of the first sub-pad portion toward another of the at least two pads, and the second sub-pad portion of the one pad protrudes from an end portion of the third sub-pad portion of the one pad toward the other of the at least two pads.

7. The PCB of claim 6, further comprising:
a first connection bridge in a portion of a space between the first and third sub-pad portions; and
a second connection bridge in a portion of a space between the second and third sub-pad portions;
wherein in one of the at least two pads, the first and third sub-pad portions are connected to each other by the first connection bridge, and the second and third sub-pad portions are connected to each other by the second connection bridge; and
wherein the first, second, and third sub-pad portions and the first and second connection bridges are integrally formed and at a same level as a main surface of the substrate.

8. The PCB of claim 6, wherein the first to third sub-pad portions included in one of the at least two pads are spaced apart from one another and electrically connected to one another by a buried conductive layer included in the substrate.

9. The PCB of claim 8, further comprising a conductive via extending from each of the first to third sub-pad portions into the substrate and connecting each of the first to third sub-pad portions to the buried conductive layer.

10. The PCB of claim 8, further comprising:
an interconnection pattern extending from the first sub-pad portion; and
a conductive via extending from each of the second and third sub-pad portions and the interconnection pattern into the substrate and connecting each of the second and third sub-pad portions and the interconnection pattern to the buried conductive layer.

11. The PCB of claim 6, further comprising an interconnection pattern that electrically connects the first and second sub-pad portions to each other,
wherein the first sub-pad portion, the second sub-pad portion, and the interconnection pattern included in one of the at least two pads are portions of a conductive pattern layer, are integrally formed and are at a same level as a main surface of the substrate, and
wherein the third sub-pad portion is spaced apart from the first and second sub-pad portions and electrically connected to any one of the first sub-pad portion and the second sub-pad portion by a buried conductive layer formed in the substrate.

12. A printed circuit board (PCB), comprising:
a substrate; and
a pad group on a surface of the substrate, the pad group comprising at least two pads, each of the at least two pads comprising a plurality of first sub-pad portions and a second sub-pad portion, different and separate from the plurality of first sub-pad portions, the second sub-pad portion having a rectangular shape,
wherein in each of the at least two pads, the respective first sub-pad portions partially surround at least three sides of the second sub-pad portion and are sequentially arranged in a direction away from the second sub-pad portion, and
wherein the second sub-pad portion of one of the at least two pads protrudes from an end portion of each of the first sub-pad portions toward another of the at least two pads.

13. The PCB of claim 12, wherein an end portion of a first sub-pad portion of the plurality of first sub-pad portions included in one of the at least two pads that is relatively closer to the second sub-pad portion than the other first sub-pad portion extends further toward another of the at least two pads than an end portion of a first sub-pad portion that is relatively farther from the second sub-pad portion.

14. The PCB of claim 12, wherein each of the plurality of first sub-pad portions included in the one pad has a U shape.

15. The PCB of claim 14, wherein a side of an edge of the second sub-pad portion of the one pad of the at least two pads protrudes from an end portion of each of the plurality of first sub-pad portions toward another of the at least two pads.

16. The PCB of claim 15, wherein each of the plurality of first sub-pad portions of the one pad of the at least two pads surrounds a side of the second sub-pad portion opposite to the one side of the second sub-pad portion and partially surrounds two sides of the second sub-pad portion connected to the opposite side.

17. A printed circuit board (PCB), comprising:
a substrate; and
a pad group on a surface of the substrate, the pad group comprising at least two pads, each of the at least two pads comprising a first sub-pad portion and a second sub-pad portion, different and separate from the first sub-pad portion,
wherein the pad group is symmetric with respect to a first line passing between the at least two pads,
wherein the respective first sub-pad portions partially surround at least three sides of the second sub-pad portions and are sequentially arranged in a direction away from the second sub-pad portion,
wherein a distance between the respective second sub-pad portions of the at least two pads are separated by a smaller distance than the respective first sub-pad portions, and
wherein the first and second sub-pad portions of each of the at least two pads are electrically connected.

18. The PCB of claim 17, wherein each of the at least two pads are symmetric with respect to a second line passing through both of the at least two pads.

19. The PCB of claim 17, wherein an end portion of the first sub-pad portion included in one of the at least two pads that is relatively closer to the second sub-pad portion than the other first sub-pad portion extends further toward another of the at least two pads than an end portion of a first sub-pad portion that is relatively farther from the second sub-pad portion.

20. The PCB of claim 17, wherein each of the first sub-pad portions included in the one pad has a U shape.

* * * * *